US012752329B2

(12) United States Patent
Yang et al.

(10) Patent No.: US 12,752,329 B2
(45) Date of Patent: Oct. 6, 2026

(54) METHOD OF FABRICATING METAL MASK

(71) Applicant: Darwin Precisions Corporation, Hsinchu County (TW)

(72) Inventors: Yun-Pei Yang, Hsinchu County (TW); Jen-Shun Lin, Hsinchu County (TW); Yu-Wei Chang, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 222 days.

(21) Appl. No.: 18/913,066

(22) Filed: Oct. 11, 2024

(65) Prior Publication Data

US 2025/0033102 A1 Jan. 30, 2025

Related U.S. Application Data

(62) Division of application No. 17/547,446, filed on Dec. 10, 2021, now abandoned.

(30) Foreign Application Priority Data

Aug. 26, 2021 (TW) ................................ 110131683

(51) Int. Cl.

| | |
|---|---|
| ***B21D 5/00*** | (2006.01) |
| ***C23C 14/04*** | (2006.01) |
| ***G03F 7/00*** | (2006.01) |
| ***H05K 3/14*** | (2006.01) |
| ***H10D 86/01*** | (2025.01) |
| *H10D 86/40* | (2025.01) |
| *H10D 86/60* | (2025.01) |

(52) U.S. Cl.

CPC .............. *B21D 5/00* (2013.01); *C23C 14/042* (2013.01); *G03F 7/0015* (2013.01); *H05K 3/143* (2013.01); *H10D 86/0231* (2025.01); *H10D 86/441* (2025.01); *H10D 86/60* (2025.01)

(58) Field of Classification Search

None

See application file for complete search history.

(56) References Cited

U.S. PATENT DOCUMENTS

| | | | |
|---|---|---|---|
| 5,091,212 | A | 2/1992 | Sakai |
| 5,694,155 | A | 12/1997 | Stapleton et al. |
| 2004/0137161 | A1 | 7/2004 | Segawa et al. |
| 2007/0157879 | A1 | 7/2007 | Yotsuya |

(Continued)

FOREIGN PATENT DOCUMENTS

| | | | |
|---|---|---|---|
| CN | 100999811 | A | 7/2007 |
| CN | 101667529 | A | 3/2010 |

(Continued)

*Primary Examiner* — Shamim Ahmed
(74) *Attorney, Agent, or Firm* — WPAT, PC

(57) ABSTRACT

A method of fabricating a metal mask includes receiving a metal planar substrate and patterning the metal planar substrate. The metal planar substrate includes a first surface and a second surface opposite to the first surface. The patterning the metal planar substrate includes forming strip-shaped structures, forming through holes, and forming a blind hole in a direction from the first surface to the second surface. The through holes extend to the first surface and the second surface. The through holes and the strip-shaped structures are alternately arranged. The blind hole extends across the through holes.

15 Claims, 24 Drawing Sheets

(56) References Cited

U.S. PATENT DOCUMENTS

| | | | |
|---|---|---|---|
| 2010/0055810 | A1 | 3/2010 | Sung |
| 2011/0109511 | A1 | 5/2011 | Andrenko et al. |
| 2014/0290574 | A1* | 10/2014 | Kim ...................... C23C 14/042 118/504 |
| 2014/0377903 | A1* | 12/2014 | Takeda .................... B05B 12/20 438/99 |
| 2015/0118391 | A1 | 4/2015 | Kilhenny |
| 2015/0303360 | A1 | 10/2015 | Yoo et al. |
| 2015/0376765 | A1 | 12/2015 | Xiong |
| 2016/0049586 | A1 | 2/2016 | Takeda et al. |
| 2016/0268511 | A1 | 9/2016 | Takeda et al. |
| 2016/0372669 | A1 | 12/2016 | Sung |
| 2017/0186955 | A1 | 6/2017 | Takeda et al. |
| 2018/0277763 | A1 | 9/2018 | Takeda et al. |
| 2019/0123280 | A1 | 4/2019 | Takeda et al. |
| 2019/0259951 | A1 | 8/2019 | Mug |
| 2019/0363257 | A1 | 11/2019 | Takeda et al. |
| 2020/0043696 | A1 | 2/2020 | Song |
| 2020/0227640 | A1 | 7/2020 | Seong |
| 2021/0066601 | A1 | 3/2021 | Takeda et al. |
| 2022/0013753 | A1 | 1/2022 | Xu |
| 2022/0149283 | A1 | 5/2022 | Seong |
| 2022/0157629 | A1 | 5/2022 | Antoniolli |
| 2023/0064427 | A1 | 3/2023 | Yang |

FOREIGN PATENT DOCUMENTS

| | | | |
|---|---|---|---|
| CN | 104561896 | A | 4/2015 |
| CN | 105220185 | A | 1/2016 |
| CN | 109844974 | A | 6/2019 |
| CN | 110211973 | A | 9/2019 |
| TW | 565895 | B | 12/2003 |
| TW | 201833389 | A | 9/2018 |
| TW | 202012663 | A | 4/2020 |
| TW | 202100776 | A | 1/2021 |
| WO | WO2021047610 | A1 | 3/2021 |

* cited by examiner

METHOD OF FABRICATING METAL MASK

CROSS-REFERENCE TO RELATED APPLICATION

The present application is a Divisional Application of the U.S. application Ser. No. 17/547,446, filed Dec. 10, 2021, which claims priority to Taiwan Application Serial Number 110131683, filed Aug. 26, 2021, all of which are herein incorporated by reference in their entireties.

BACKGROUND

Field of Invention

The present disclosure relates to a method of fabricating a metal mask.

Description of Related Art

The display device has been used in a variety of applications. The display device includes various electrical components and wires connecting the electrical components. For example, the wire can transmit signal to a thin film transistor (TFT) and apply a voltage to an electrode in the TFT. In response to the market demand, the screen to body ratio of the display device is being increased.

Therefore, the narrow bezel display device has been developed and become popular in the market. The peripheral area of the narrow bezel display device is effectively utilized to form the wires for electrical connection between the electrical components disposed on different sides of the substrate.

SUMMARY

An aspect of the present disclosure provides a method of fabricating a metal mask. The method of fabricating the metal mask includes receiving a metal planar substrate and patterning the metal planar substrate. The metal planar substrate includes a first surface and a second surface opposite to the first surface. The patterning the metal planar substrate includes forming strip-shaped structures, forming through holes, and forming a blind hole in a direction from the first surface to the second surface. The through holes extend to the first surface and the second surface. The through holes and the strip-shaped structures are alternately arranged. The blind hole extends across the through holes.

An aspect of the present disclosure provides a method of fabricating a metal mask. The method of fabricating the metal mask includes receiving a metal planar substrate and patterning the metal planar substrate. The metal planar substrate includes a first surface and a second surface opposite to the first surface. A lithography process is performed to form a first pattern on the first surface extending in a first direction, a second pattern on the first surface extending in a second direction and a third pattern corresponding to the first pattern on the second surface, wherein the first direction and the second direction are perpendicular to each other. An etching process is performed to remove a portion of the metal planar substrate such that a plurality of through holes is formed through the first pattern and the third pattern, and a plurality of blind holes is formed through the second pattern. The plurality of blind holes is used as bending axis respectively to bend the metal planar substrate such that the metal mask becomes three-dimensional.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
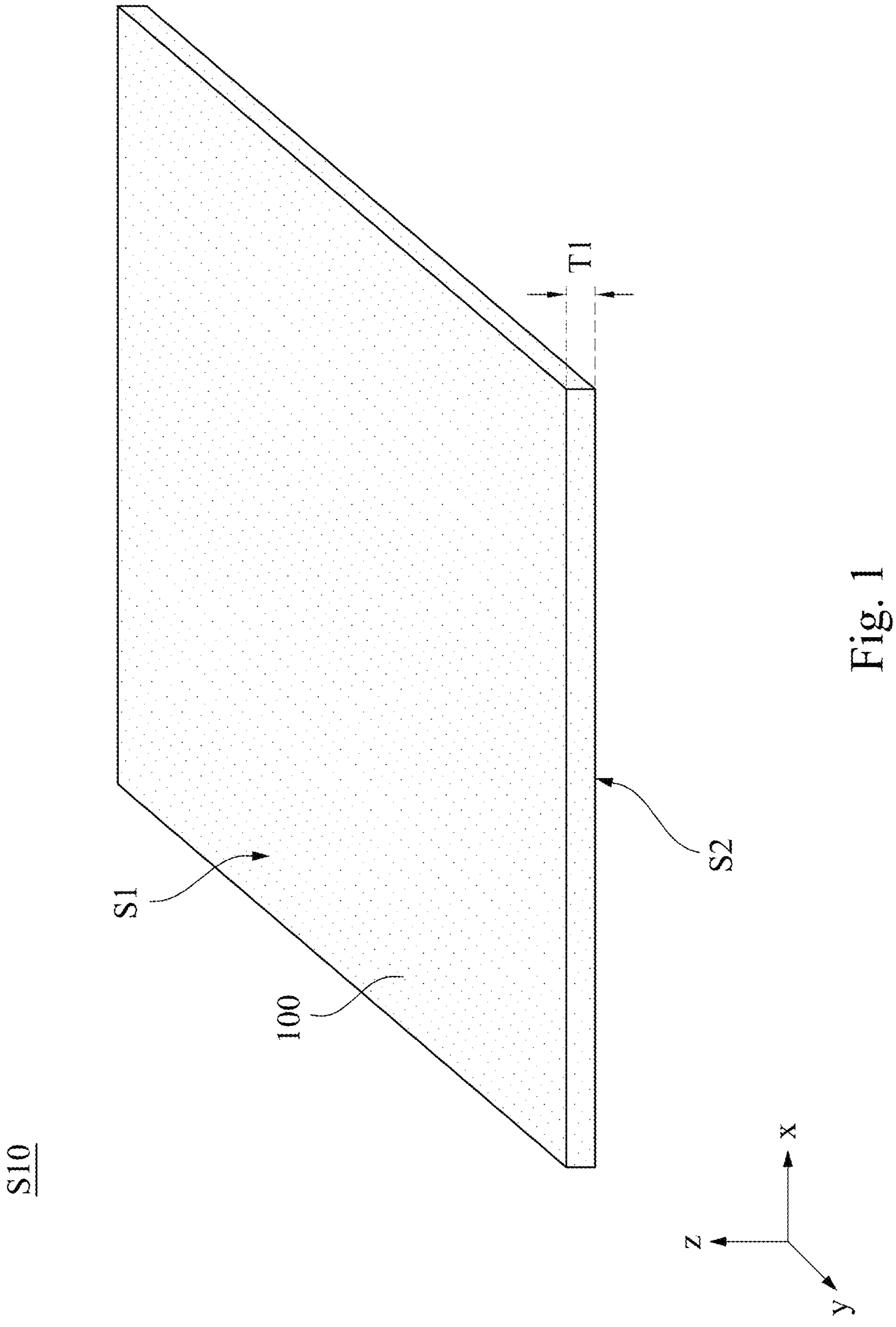
FIG. 1 is a view of an intermediate stage of fabricating a metal mask according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The following disclosure provides many different embodiments, or examples, for implementing different features of the disclosure. For illustration clarity, many details of practice are explained in the following descriptions. However, it should be understood that these details of practice do not intend to limit the present disclosure. That is, these details of practice are not necessary in parts of embodiments of the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The use of ordinals such as first, second and third does not necessarily imply a ranked sense of order, but rather may only distinguish between multiple instances of an act or structure. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In some embodiments, the terms "about" and "substantially" can refer to a percentage of the values as interpreted by those skilled in relevant art(s) in light of the teachings herein. The terms "about" and "substantially" can indicate a value of a given quantity that varies within an acceptable deviation of the value. These values are merely examples and are not intended to be limiting.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the fabrication of a display device, particularly a narrow bezel display device, a wire formed at an edge of a substrate in the display device by using a conductive through hole, lithography techniques, or etching techniques can electrically connect various electrical components separately disposed on two opposite sides of a substrate. However, manufacturing the conductive through hole in the substrate may not be fully established in the fabrication of the display device, and a lithography process and/or an etching process may complicate the fabrication of the display device. As a result, the fabrication difficulty and cost may be increased.

The present disclosure provides a metal mask and a method of fabricating thereof. A blind hole/a bending axis formed in the metal mask can facilitate an operation of bending the metal mask to turn the metal mask into a three-dimensional metal mask. The resulted three-dimensional metal mask can be used to form wires at the edge of a substrate for electrical connection between the electrical components which are separately disposed on two opposite sides of the substrate.

FIG. 1, FIG. 2A, FIG. 3A, FIG. 4A and FIG. 5 are views of various intermediate stages of fabricating a metal mask according to some embodiments of the present disclosure. Various operations of embodiments are provided herein. The order in which some or all of the operations are described should not be construed to imply that these operations are necessarily order dependent. Alternative ordering will be appreciated having the benefit of this description. Additional operations can be provided before, during, and/or after the operations disclosed herein, and may be briefly described herein. Further, it will be understood that not all operations are necessarily present in each embodiment provided herein. Also, it will be understood that not all operations are necessary in some embodiments. FIG. 2B, FIG. 3B and FIG. 4B are views from an observation angle of inverted FIG. 2A, FIG. 3A and FIG. 4A, respectively.

FIG. 1 illustrates step S10 of receiving a metal planar substrate 100. The metal planar substrate 100 can include a first surface S1 (e.g., parallel to the xy plane) and a second surface S2 opposite to the first surface S1. The metal planar substrate 100 includes metal. In some embodiments, the metal planar substrate 100 may include Cu, Ni, Fe, Co, Sn, Cr, Ti, Al, other suitable metal, an alloy of the above-mentioned metal, or a combination thereof. For example, the metal planar substrate 100 can include Ni. In some other embodiments, the metal planar substrate 100 can include stainless steel.

The metal planar substrate 100 can include a thickness T1, which is related to a thickness of a metal mask formed later. In some embodiments, the thickness T1 may be between about 20 micrometers (μm) and about 150 μm. If the thickness T1 is greater than the above-noted upper limits, the difficulty and cost may be increased in the subsequent processes (e.g., in an etching process). If the thickness T1 is less than the above-noted lower limits, handling the metal mask may become challenging. For example, the metal layer with undesirably thin thickness may require precise operation and gentle treatment to ensure an intact profile of the metal layer. In some embodiments, the thickness T1 of the metal planar substrate 100 can be a uniform thickness.

Subsequently, the metal planar substrate 100 can be patterned to form the metal planar substrate 100 into a predetermined structure. The operations of pattering the metal planar substrate 100 are described in FIG. 2A to FIG. 4B.

Figure 2A:
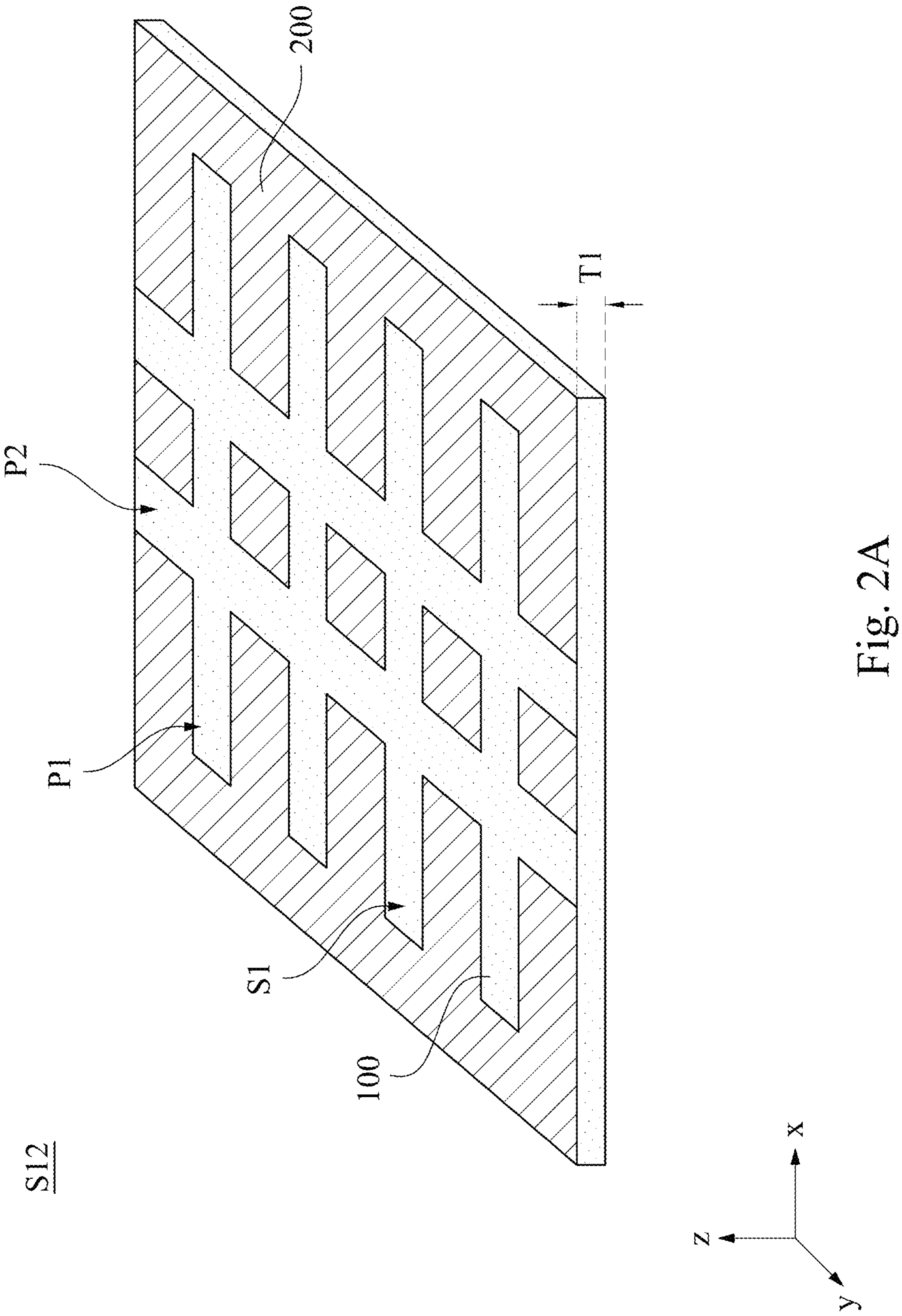
FIG. 2A is a view of an intermediate stage of fabricating a metal mask according to some embodiments of the present disclosure.
Figure 2B:
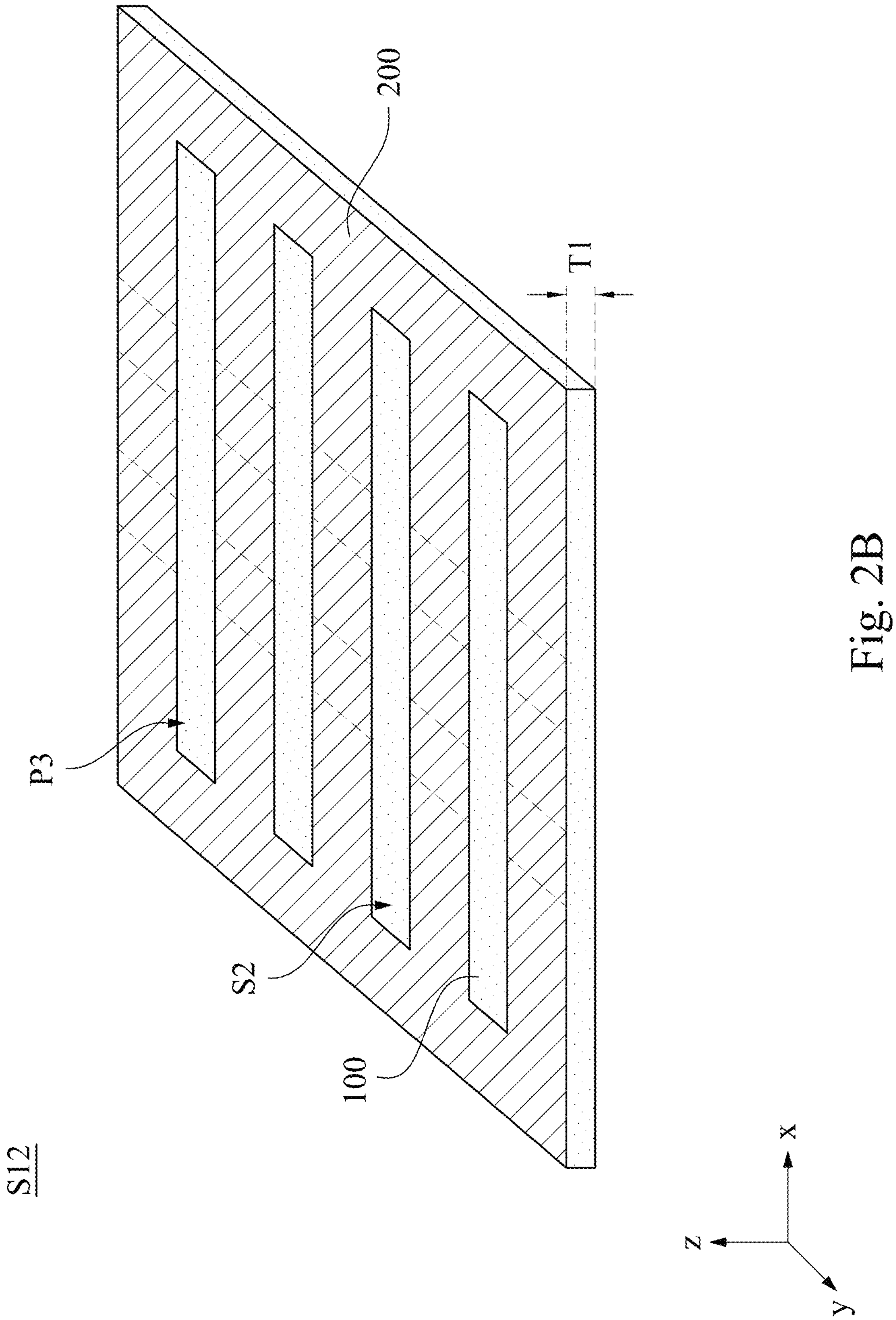
FIG. 2B is a view of FIG. 2A from another observation angle.

FIG. 2A and FIG. 2B illustrate step S12 of performing a lithography process to form a first pattern P1 on the first surface S1, a second pattern P2 on the first surface S1 and a third pattern P3 on the second surface S2. In detail, a photoresist 200 is firstly formed on the first surface S1 and the second surface S2 of the metal planar substrate 100. In some embodiments, the photoresist 200 can be formed by spin coating, dry film lamination or other suitable techniques. Subsequently, an exposure process through a mask (not illustrated herein) and a development process can be performed on the photoresist 200 to form the patterned photoresist 200 with the first pattern P1, the second pattern P2 and the third pattern P3. As shown in FIG. 2A and FIG. 2B, a portion of the metal planar substrate 100 can be exposed in the first pattern P1, the second pattern P2 and the third pattern P3.

The first pattern P1 and the second pattern P2 are on the first surface S1, and the third pattern P3 is on the second surface S2. The first pattern P1 can be elongated and extend in a first direction (e.g., extend along the x axis). The second pattern P2 can be elongated and extend in a second direction which may be perpendicular to the first direction (e.g., extend along the y axis). The third pattern P3 can be designed to correspond to the first pattern P1. For example, an arrangement of the third pattern P3 can be substantially the same as an arrangement of the first pattern P1. In other words, a projection of the first pattern P1 on the second surface S2 can overlap the third pattern P3 on the second surface S2. Thus, the third pattern P3 can also be elongated and extend in the first direction (e.g., extend along the x axis). The dashed lines illustrated in FIG. 2B indicate a projection of the second pattern P2 on the second surface S2.

In some embodiments as illustrated in FIG. 2A and FIG. 2B, the first pattern P1 and the third pattern P3 can individually include 4 elongated openings. The arrangement of the first pattern P1 and the arrangement of the third pattern P3 can be adjusted based on various process requirements or product designs, and therefore the present disclosure is not limited to the shape (e.g., elongated) or the number (e.g., 4) of openings. Similarly, the second pattern P2 can include 2 elongated openings as shown in FIG. 2A, but the present disclosure is not limited to the shape (e.g., elongated) or the number (e.g., 2) of openings.

Figure 3A:
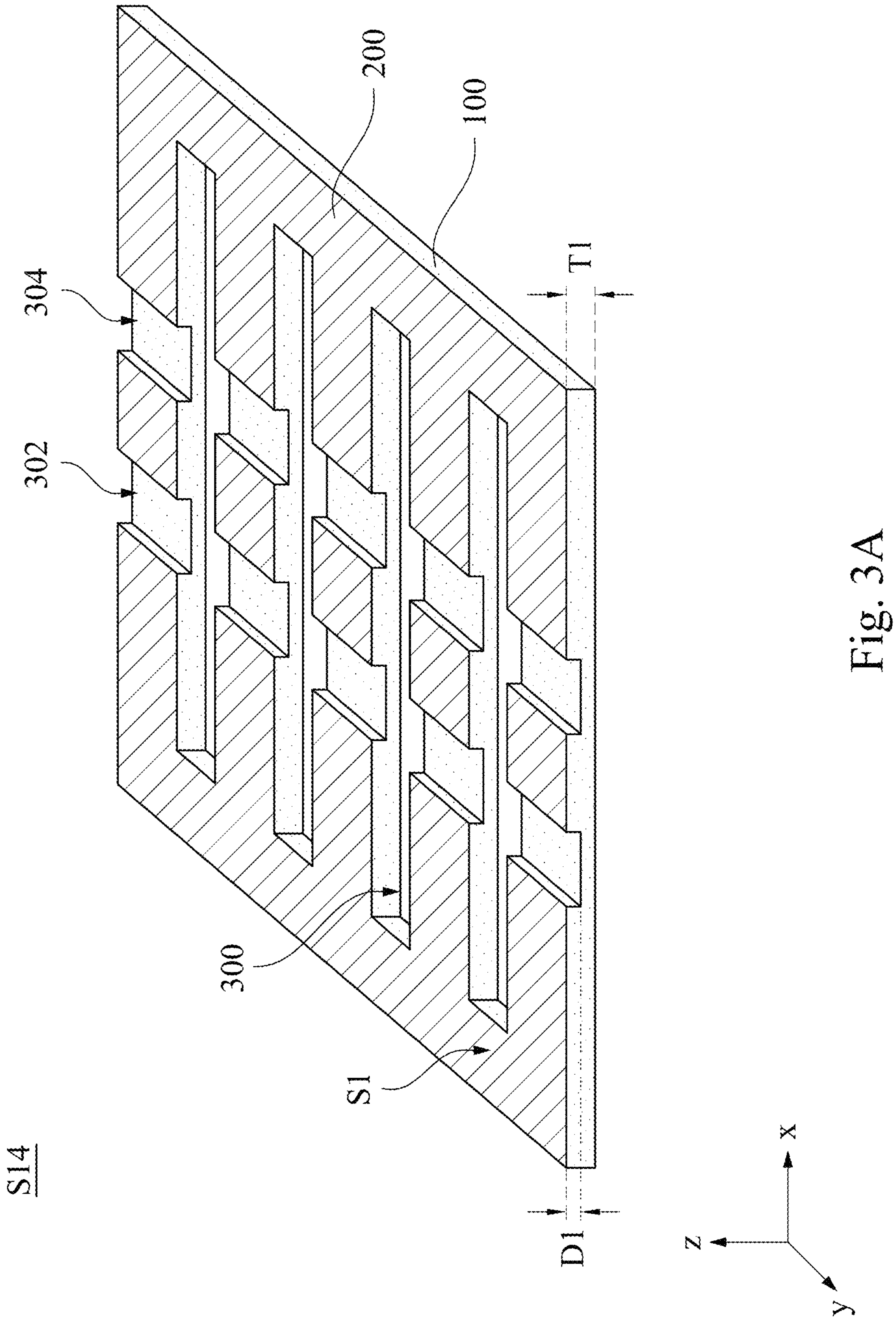
FIG. 3A is a view of an intermediate stage of fabricating a metal mask according to some embodiments of the present disclosure.
Figure 3B:
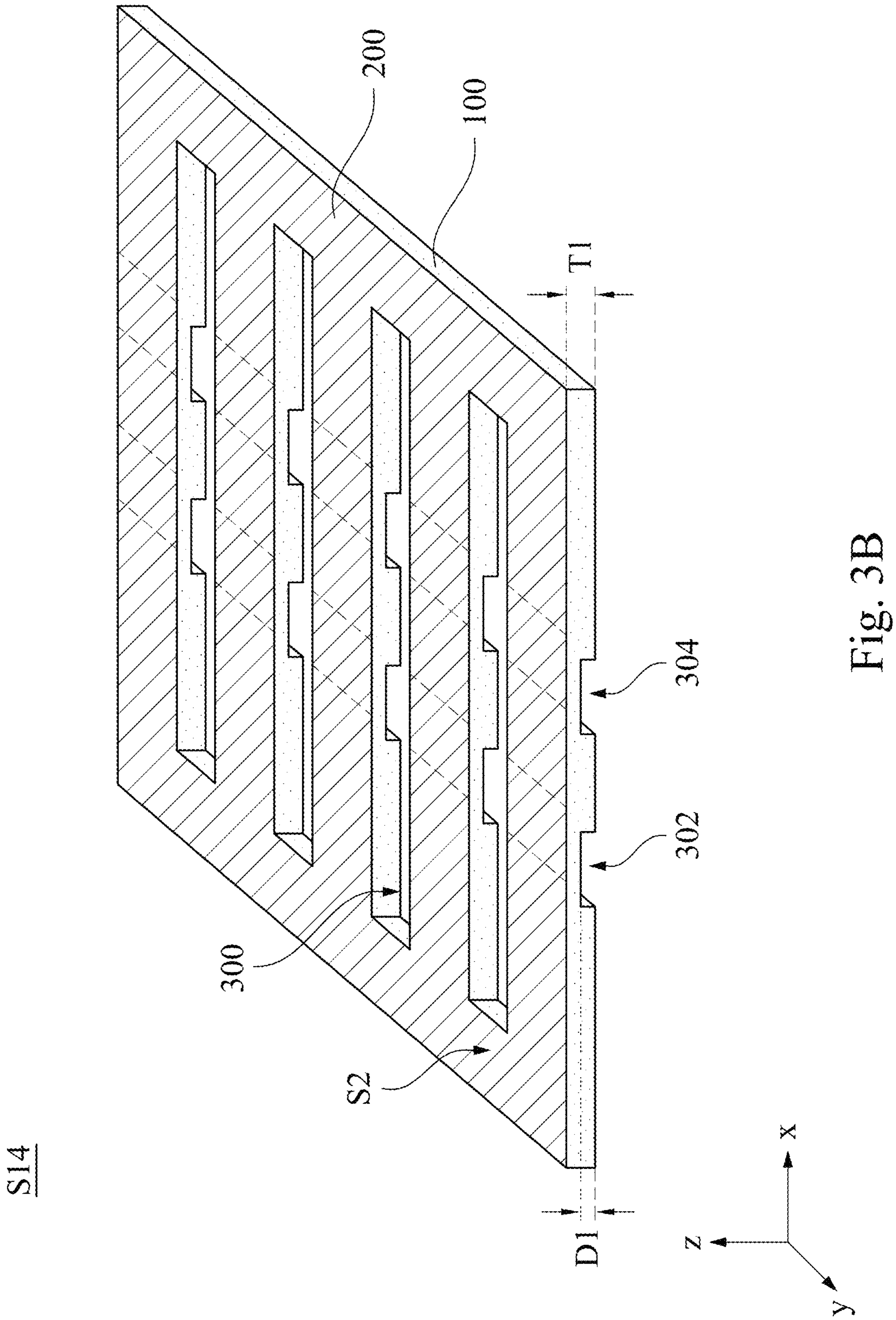
FIG. 3B is a view of FIG. 3A from another observation angle.

FIG. 3A and FIG. 3B illustrate step S14 of performing an etching process to remove the portion of the metal planar substrate exposed in the first pattern P1, the second pattern P2 and the third pattern P3. Multiple through holes 300 may be formed by etching the metal planar substrate 100 through the first pattern P1 and the third pattern P3. A first blind hole 302 and a second blind hole 304 may be formed in the metal planar substrate 100 by etching the metal planar substrate 100 through the second pattern P2.

During the etching process, etchants can concurrently etch the metal planar substrate 100 from the first surface S1 through the first pattern P1 and from the second surface S2 through the third pattern P3, thereby forming the through holes 300 extending to the first surface S1 and the second surface S2. The etchants can etch the metal planar substrate 100 from the first surface S1 through the second pattern P2 to recess the first surface S1 of the metal planar substrate 100, thereby forming the first blind hole 302 and the second blind hole 304 in the first surface S1.

In a further description, during the etching process to remove the portion of the metal planar substrate 100, the thickness T1 of the metal planar substrate 100 may be reduced by at least about 25%. For example, about 25% of thickness T1, about 50% of thickness T1, or other suitable amount of thickness T1 may be removed off. In some embodiments, a removal amount for forming the first blind hole 302 or the second blind hole 304 can be about 25% of the thickness T1. In other words, a depth D1 of the first blind hole 302 and the second blind hole 304 may be about 25% of the thickness T1.

A pattern of the through holes 300 can correspond to the first pattern P1 and the third pattern P3. Therefore, the through holes 300 can be elongated and extend in the first direction (e.g., extend along the x axis). A pattern of the first blind hole 302 and the second blind hole 304 can correspond to the second pattern P2. Therefore, the first blind hole 302 and the second blind hole 304 can be elongated and extend in the second direction which is substantially perpendicular to the first direction (e.g., extend along the y axis). In some embodiments, the first blind hole 302 and the second blind hole 304 may be designed to be parallel to each other. In some embodiments, an individual width of the first blind hole 302 or the second blind hole 304 (e.g., a dimension along the x axis) may be less than an individual width of the through holes 300 (e.g., a dimension along the y axis).

It is noted that the present disclosure is not limited to the above description about performing the lithography process and the etching process on the double sides (e.g., the first surface S1 and the second surface S2) of the metal planar substrate 100. In some other embodiments, in step S12, the lithography process can be performed on the single side (e.g., the first surface S1) of the metal planar substrate 100 to form the patterned photoresist 200 with the first pattern P1 and the second pattern P2 on the first surface S1 of the metal planar substrate 100. Further, in step 14, in the case of the patterned photoresist 200 disposed on the single side (e.g., the first surface S1) of the metal planar substrate 100, the etching process can be performed on the metal planar substrate 100 from the first surface S1 through the first pattern P1 to form the through holes 300 as well as through the second pattern P2 to form the first blind hole 302 and the second blind hole 304.

Figure 4A:
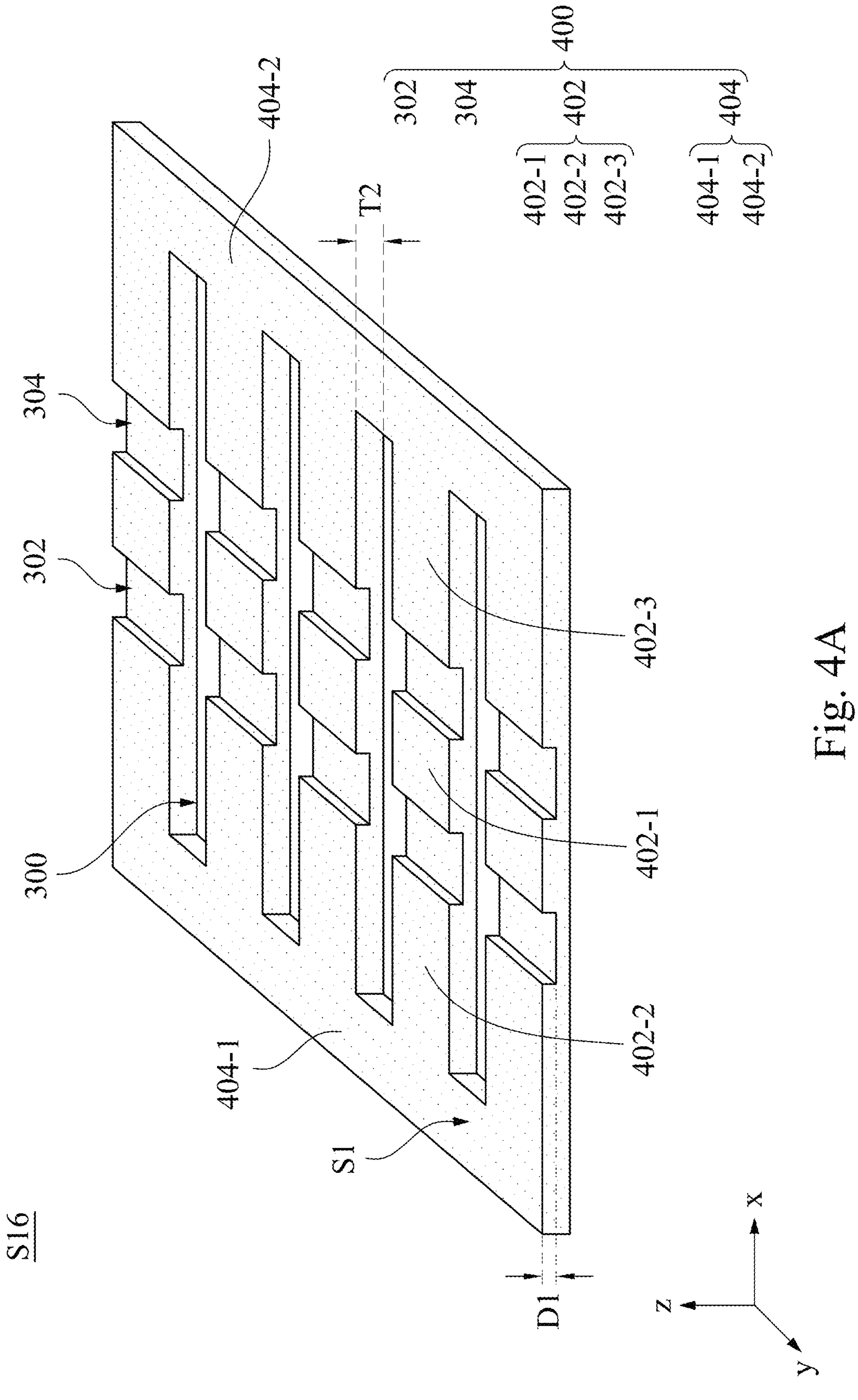
FIG. 4A is a view of an intermediate stage of fabricating a metal mask according to some embodiments of the present disclosure.
Figure 4B:
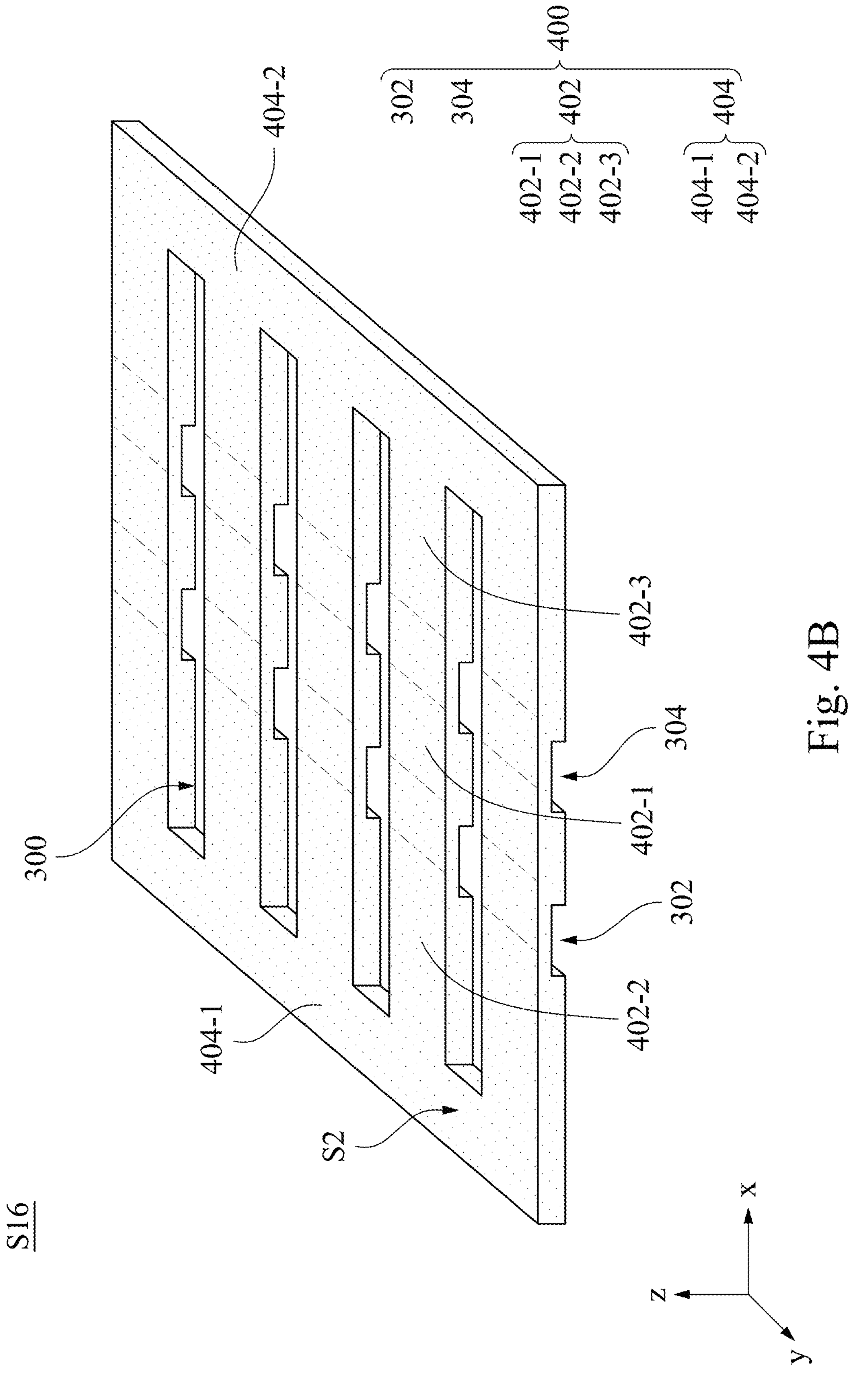
FIG. 4B is a view of FIG. 4A from another observation angle.

FIG. 4A and FIG. 4B illustrate step S16 of removing the photoresist 200. After removing the photoresist 200, the patterned metal planar substrate 100 can become a metal mask 400. As shown in FIG. 4A and FIG. 4B, the metal mask 400 can have multiple strip-shaped structures 402, a board portion 404 including a first board portion 404-1 and a second board portion 404-2, the first blind hole 302, and the second blind hole 304. The strip-shaped structures 402 can extend in the first direction (e.g., extend along the x axis) and connect the first board portion 404-1 and the second board portion 404-2. The first blind hole 302 and the second blind hole 304 can be disposed in the first surface S1 and can be a recess in a direction from the first surface S1 to the second surface S2. In some embodiments, the first blind hole 302 and the second blind hole 304 can be elongated extending in the second direction which may be substantially perpendicular to the first direction (e.g., extend along the y axis) and across the strip-shaped structures 402.

In previous step S14, the strip-shaped structures 402 can be formed as soon as the through holes 300 (see FIG. 3A) are formed. The through holes 300 and the strip-shaped structures 402 can be alternately arranged. In other words, two adjacent strip-shaped structures 402 can be spaced apart by the through holes 300. As a result, the through holes 300 defined by the first pattern P1 and the third pattern P3 can determine an arrangement of the strip-shaped structures 402.

Specifically, the strip-shaped structures 402 may include a first section 402-1, a second section 402-2 and a third section 402-3. In some embodiments, the first section 402-1 may be between and connect the second section 402-2 and the third section 402-3. In addition, the second section 402-2 may connect the first board portion 404-1 and the first section 402-1, and the third section 402-3 may connect the second board portion 404-2 and the first section 402-1. In some embodiments, the first blind hole 302 may be between the first section 402-1 and the second section 402-2, and the second blind hole 304 may be between the first section 402-1 and the third section 402-3. In some embodiments where the thickness T1 (see FIG. 1) of the metal planar substrate 100 is uniform, a thickness T2 of the strip-shaped structures 402 may be uniform. In some embodiments, the thickness T2 of the strip-shaped structures 402 may substantially be the same as the thickness T1 (see FIG. 1) of the metal planar substrate 100. In some embodiments, the thickness T2 of the strip-shaped structures 402 can be between about 20 μm and about 150 μm.

The first blind hole 302 may be positioned between the first section 402-1 and the second section 402-2, and the second blind hole 304 may be positioned between the first section 402-1 and the third section 402-3. In some embodiments, the depth D1 from the first surface S1 to form the first blind hole 302 and the second blind hole 304 may be at least about 25% of the thickness T2 of the strip-shaped structures 402. That is, the thickness T2 of the strip-shaped structures 402 can be about 1 time to about 4 times the depth D1 from the first surface S1 to form the first blind hole 302 and the second blind hole 304.

For example, the depth D1 of the first blind hole 302 and the second blind hole 304 can be about 50% of the thickness T2 of the strip-shaped structures 402, meaning the thickness T2 of the strip-shaped structures 402 can be about twice the depth D1 of the first blind hole 302 and the second blind hole 304.

In some embodiments, the first blind hole 302 and the second blind hole 304 can respectively be used as a first bending axis 302 and a second bending axis 304 to bend the metal mask 400. A greater detail will be described later with reference of FIG. 5. In the embodiments where the first blind hole 302 and the second blind hole 304 can respectively be used as the first bending axis 302 and the second bending axis 304, before the metal mask 400 is bent, the first section 402-1 may be positioned between the first bending axis 302 and the second bending axis 304, the first board portion 404-1 and the second section 402-2 may be positioned next to a side of the first bending axis 302, and the second board portion 404-2 and the third section 402-3 may be positioned next to a side of the second bending axis 304.

Figure 5:
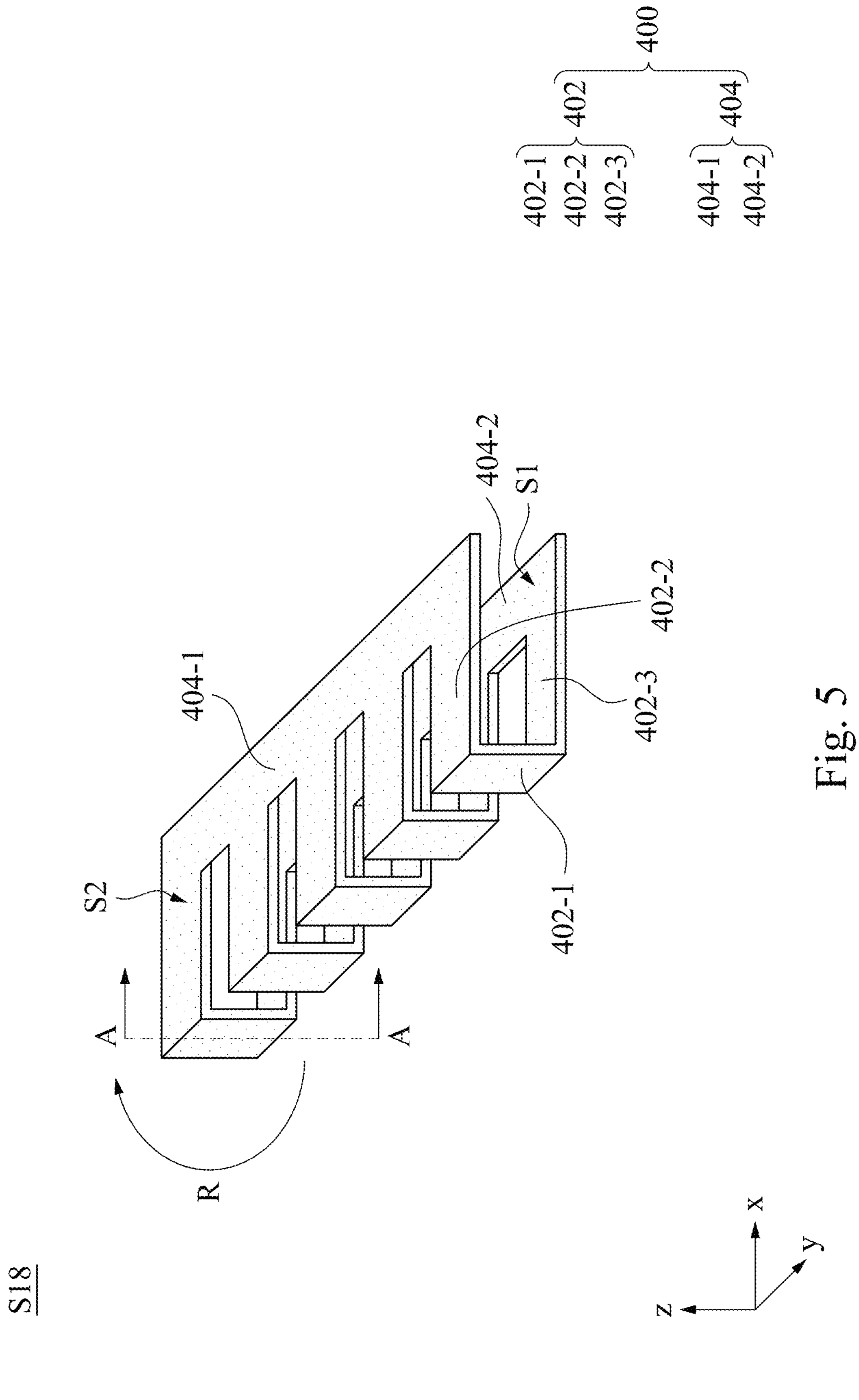
FIG. 5 is a view of an intermediate stage of fabricating a metal mask according to some embodiments of the present disclosure.

FIG. 5 illustrates step 18 of using the first blind hole 302 and the second blind hole 304 as the first bending axis 302 and the second bending axis 304 to bend the metal mask 400 such that the metal mask 400 can become three-dimensional. In FIG. 5, the metal mask 400 illustrated in FIG. 4A can be bent along a bending direction R to form the three-dimensional metal mask 400.

Consequently, the second surface S2 may become an outer surface and the first surface S1 may become an inner surface.

Figure 6:
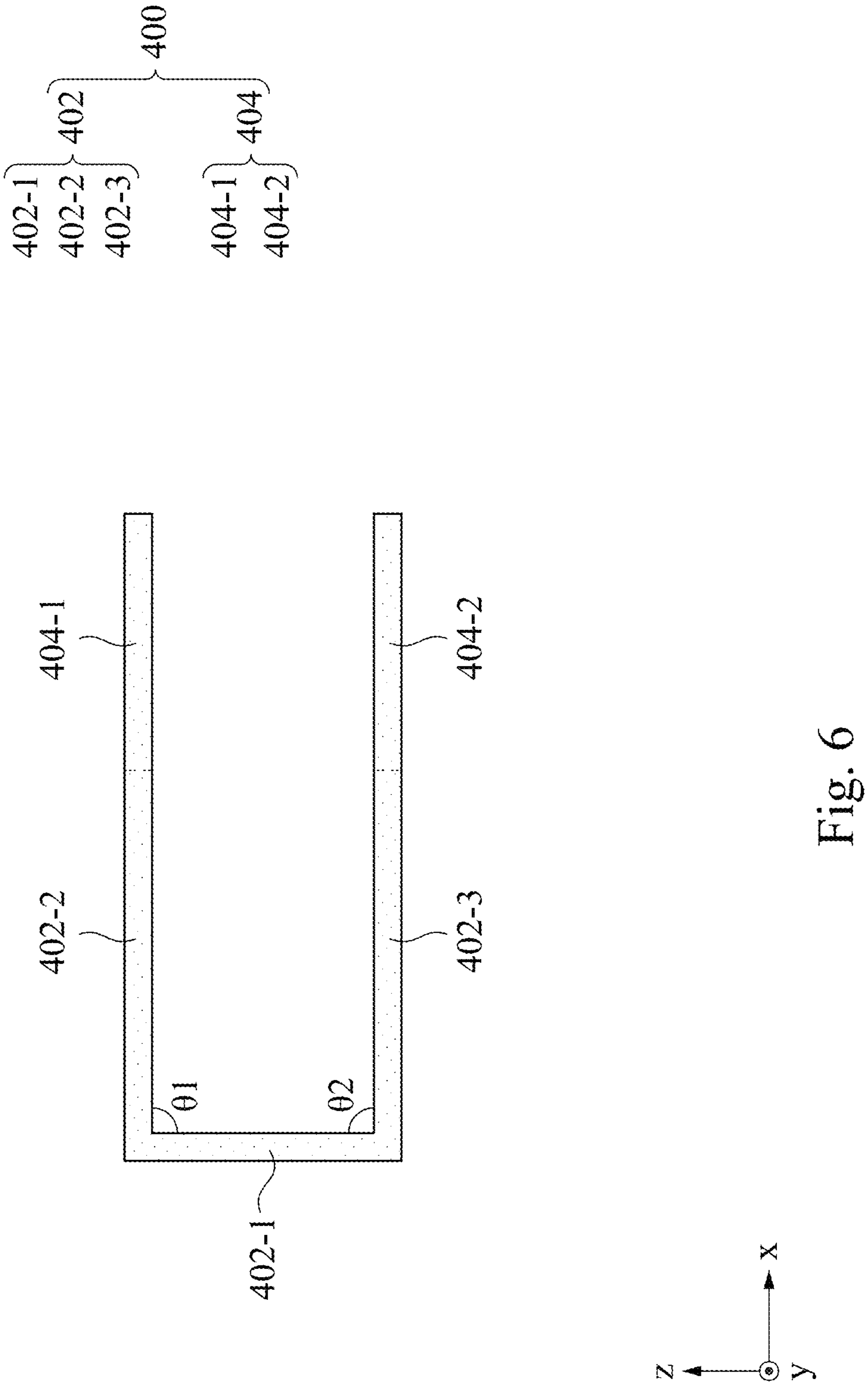
FIG. 6 is a cross-sectional view of a metal mask taken along line A-A shown in FIG. 5 according to some embodiments of the present disclosure.

Continuing in FIG. 5 and referring to FIG. 6 at the same time, FIG. 6 illustrates a cross-sectional view of the metal mask 400 in a three-dimensional profile taken along line A-A shown in FIG. 5 according to some embodiments of the present disclosure. In some embodiments as illustrated in FIG. 6, after the metal mask 400 is bent, the second section 402-2 and the third section 402-3 may face each other, and the first board portion 404-1 and the second board portion 404-2 may face each other. Further, a first angle θ1 is formed by the first section 402-1 and the second section 402-2, and a second angle θ2 is formed by the first section 402-1 and the third section 402-3. In some embodiments, the first board portion 404-1 and the second board portion 404-2 can be parallel to each other. In some embodiments as illustrated in FIG. 6, the first section 402-1, the second section 402-2 and the third section 402-3 may collectively form a C-shaped structure in a cross-sectional view of the three-dimensional metal mask 400.

Figure 7:
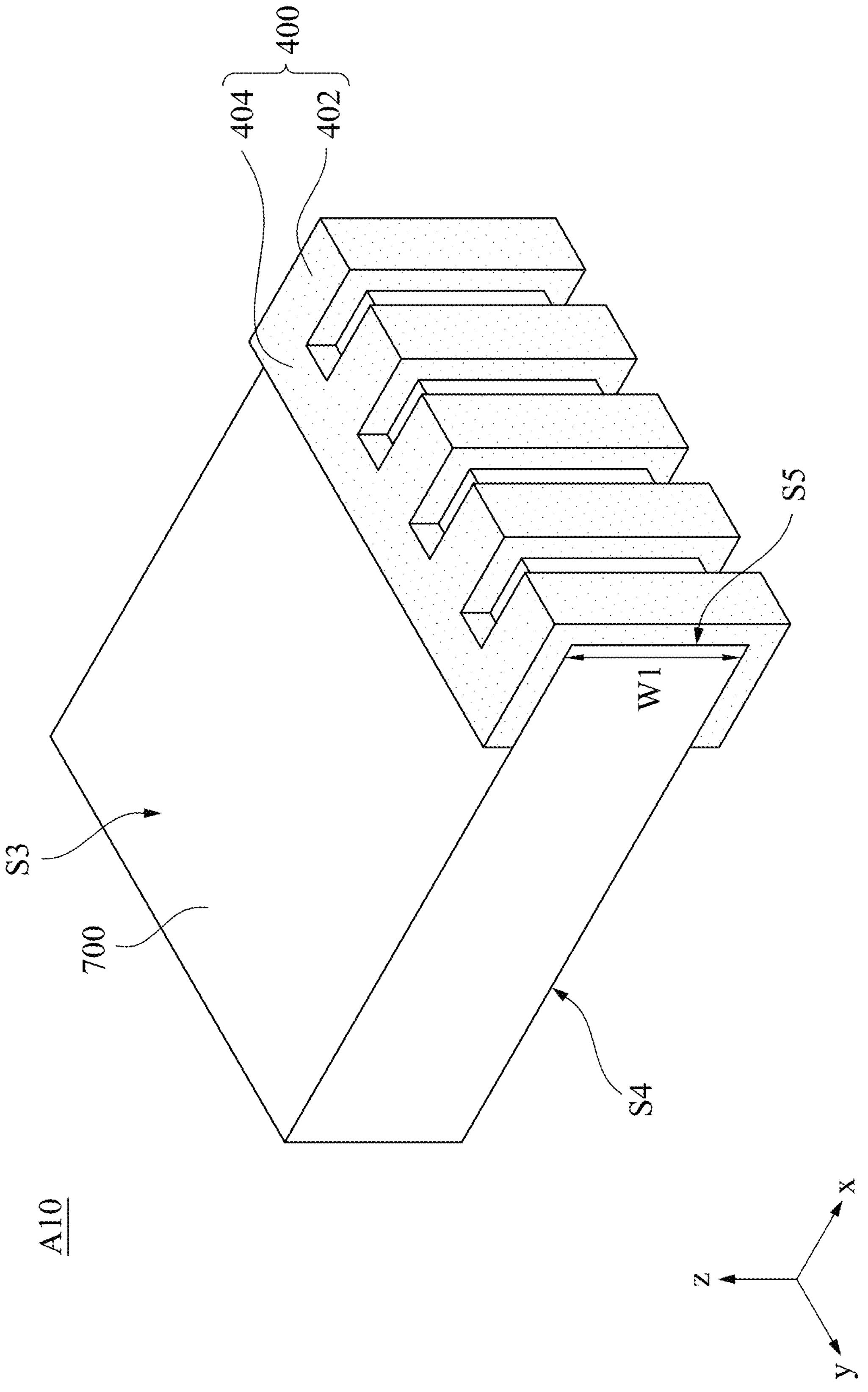
FIG. 7 to FIG. 9 are views of various intermediate stages of applying a metal mask shown in FIG. 5 according to some embodiments of the present disclosure.
Figure 8:
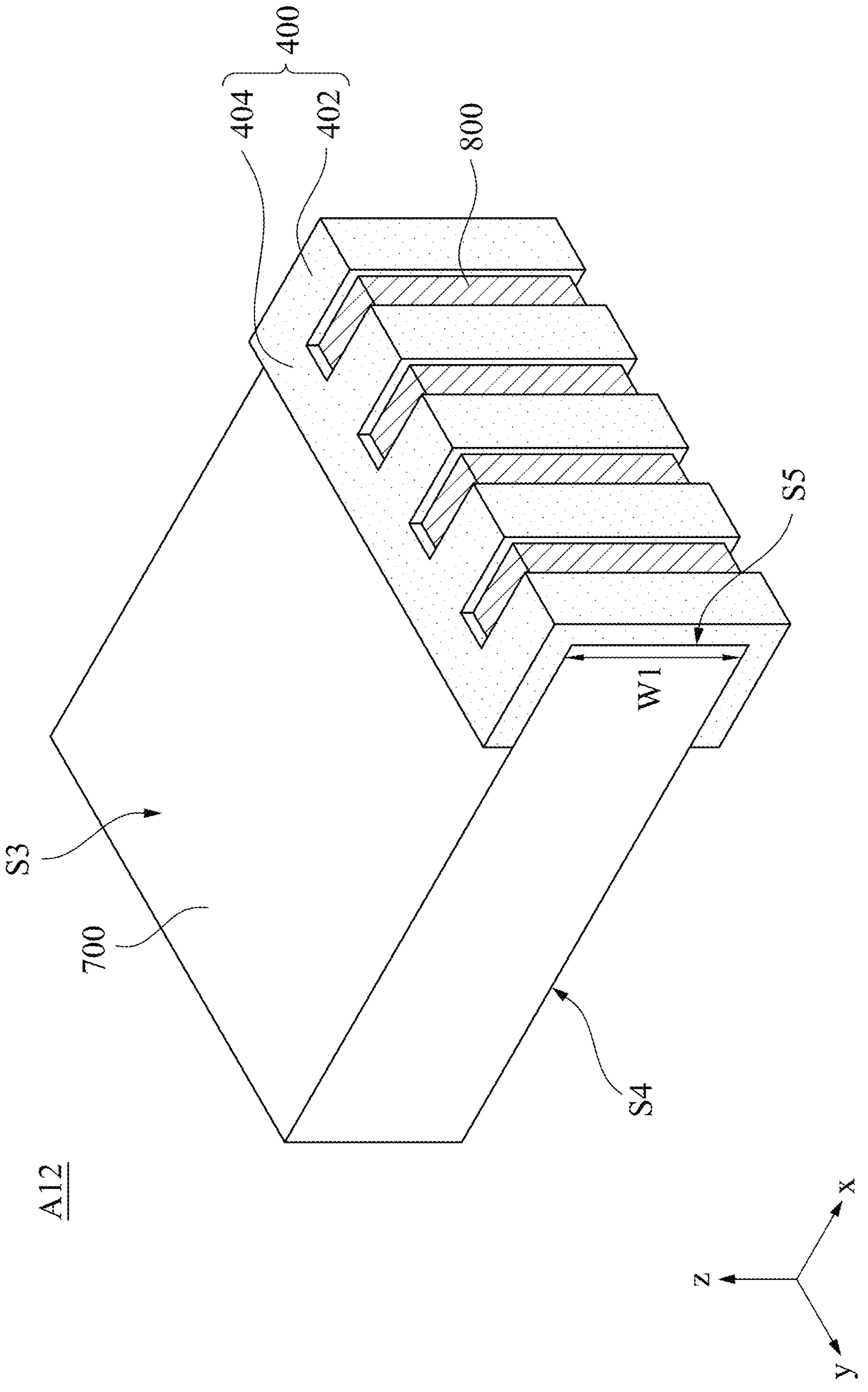
Figure 9:
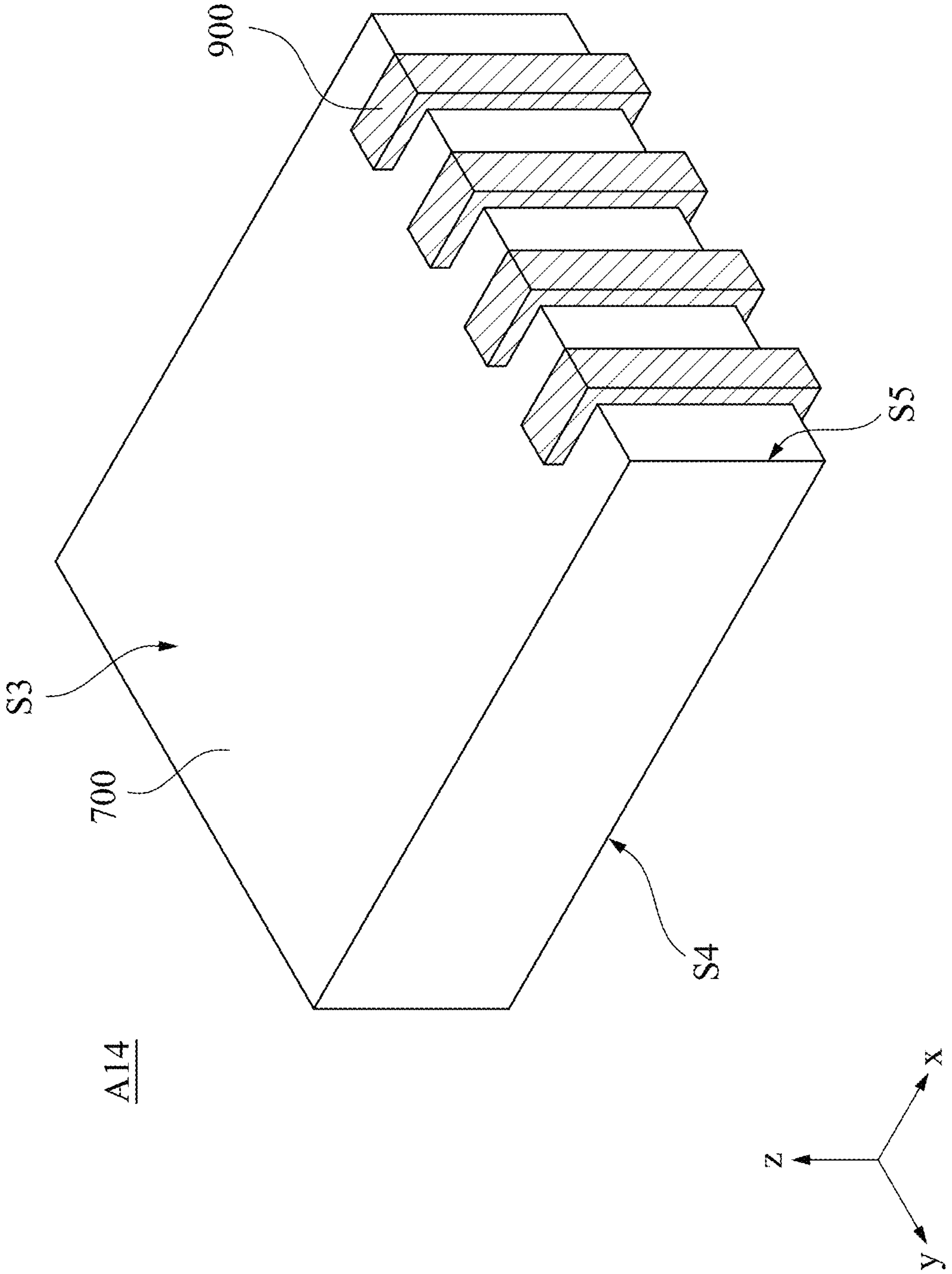

Referring to FIG. 7 to FIG. 9, FIG. 7 to FIG. 9 are views of various intermediate stages of applying the metal mask 400 in the three-dimensional profile illustrated in FIG. 5 according to some embodiments of the present disclosure. For example, the metal mask 400 in the three-dimensional profile is used to form wires at the edge of a slab-shaped substrate. Various operations of embodiments are provided herein. The order in which some or all of the operations are described should not be construed to imply that these operations are necessarily order dependent. Alternative ordering will be appreciated having the benefit of this description. Additional operations can be provided before, during, and/or after these operations in FIG. 7 to FIG. 9, and may be briefly described herein. Further, it will be understood that not all operations are necessarily present in each embodiment provided herein. Also, it will be understood that not all operations are necessary in some embodiments.

FIG. 7 illustrates step A10 of receiving a slab-shaped substrate 700 and disposing the metal mask 400 in the three-dimensional profile at the edge of the slab-shaped substrate 700. In detail, the board portion 404 of the metal mask 400 can directly contact a third surface S3 and a fourth surface S4 of the slab-shaped substrate 700. The third surface S3 and the fourth surface S4 are opposite to each other and may be parallel to the xy plane. The strip-shaped structures 402 of the metal mask 400 can directly contact the third surface S3, the fourth surface S4 and a fifth surface S5. The fifth surface S5 connects the third surface S3 and the fourth surface S4, and may be parallel to the yz plane.

The three-dimensional profile of the metal mask 400 is designed to be consistent with a profile of the slab-shaped substrate 700, thereby allowing the three-dimensional metal mask 400 to fit an edge area of the slab-shaped substrate 700. In some embodiments, a width W1 of the slab-shaped substrate 700 can substantially be the same as a length of the first section 402-1 of the strip-shaped structures 402.

FIG. 8 illustrates step A12 of forming a metal material 800 on an exposed portion of the slab-shaped substrate 700 without the metal mask 400 covered. Specifically, the metal material 800 can be formed between each of the strip-shaped structures 402. A thickness of the metal material 800 may be less than a thickness of the metal mask 400 (e.g. the thickness T2 shown in FIG. 4A). In some embodiments, a mask (not illustrated here) may be used to cover some other portions of the slab-shaped substrate 700 to avoid the metal material 800 from appearing thereon. In some embodiments, the metal material 800 can be formed by a sputtering process, an evaporation process, or any suitable process. It is noted that, in an actual operation, the metal material 800 may be formed not only on the exposed portion of the slab-shaped substrate 700 but also on the metal mask 400. For clarity, FIG. 8 is simplified by omitting to illustrate a portion of the metal material 800 on the metal mask 400.

Due to a low coefficient of heat expansion, the metal mask 400 may not be changed with temperature in terms of structure such as expansion or contraction of volume during a process of forming the metal material 800 by the sputtering process, the evaporation process or the like. Therefore, the metal mask 400 can remain original arrangement, thereby ensuring process stability of forming the metal material 800 and further increasing reliability of metal wires formed later (e.g., metal wires 900 in below FIG. 9).

FIG. 9 illustrates step A14 of removing the metal mask 400 such that the remaining metal material 900 can become the metal wires 900 at the edge of the slab-shaped substrate 700. The metal wires 900 can extend on the third surface S3, the fourth surface S4 and the fifth surface S5 continuously.

The metal wires 900 can electrically connect various electrical components (not illustrated here) separately disposed on the third surface S3 and fourth surface S4. With the metal mask 400, the metal wires 900 can be formed at the edge of the slab-shaped substrate 700 in a convenient way.

FIG. 10A, FIG. 11A, FIG. 12A and FIG. 13 are views of various intermediate stages of fabricating a metal mask with another structure according to some other embodiments of the present disclosure. FIG. 10B, FIG. 11B and FIG. 12B are views from an observation angle of inverted FIG. 10A, FIG. 11A and FIG. 12A, respectively. Operations for fabricating the metal mask with another structure can be similar to the operations for fabricating the metal mask 400 as above-mentioned description. For example, step S22 discussed later in FIG. 10A can be similar to step S12 discussed in FIG. 2A, step S24 discussed later in FIG. 11A can be similar to step S14 discussed in FIG. 3A, step S26 discussed later in FIG. 12A can be similar to step S16 discussed in FIG. 4A, and step S28 discussed later in FIG. 13 can be similar to step S18 discussed in FIG. 5. Further, step S10 discussed in FIG. 1 can be directly implemented in the operations for fabricating the metal mask with another structure. Therefore, no further discussions are elaborated for step S10.

Additional operations can be provided before, during, and/or after these operations in FIG. 10A, FIG. 11A, FIG. 12A and FIG. 13, and may be briefly described herein. Further, it will be understood that not all operations are necessarily present in each embodiment provided herein. Also, it will be understood that not all operations are necessary in some embodiments.

Figure 10A:
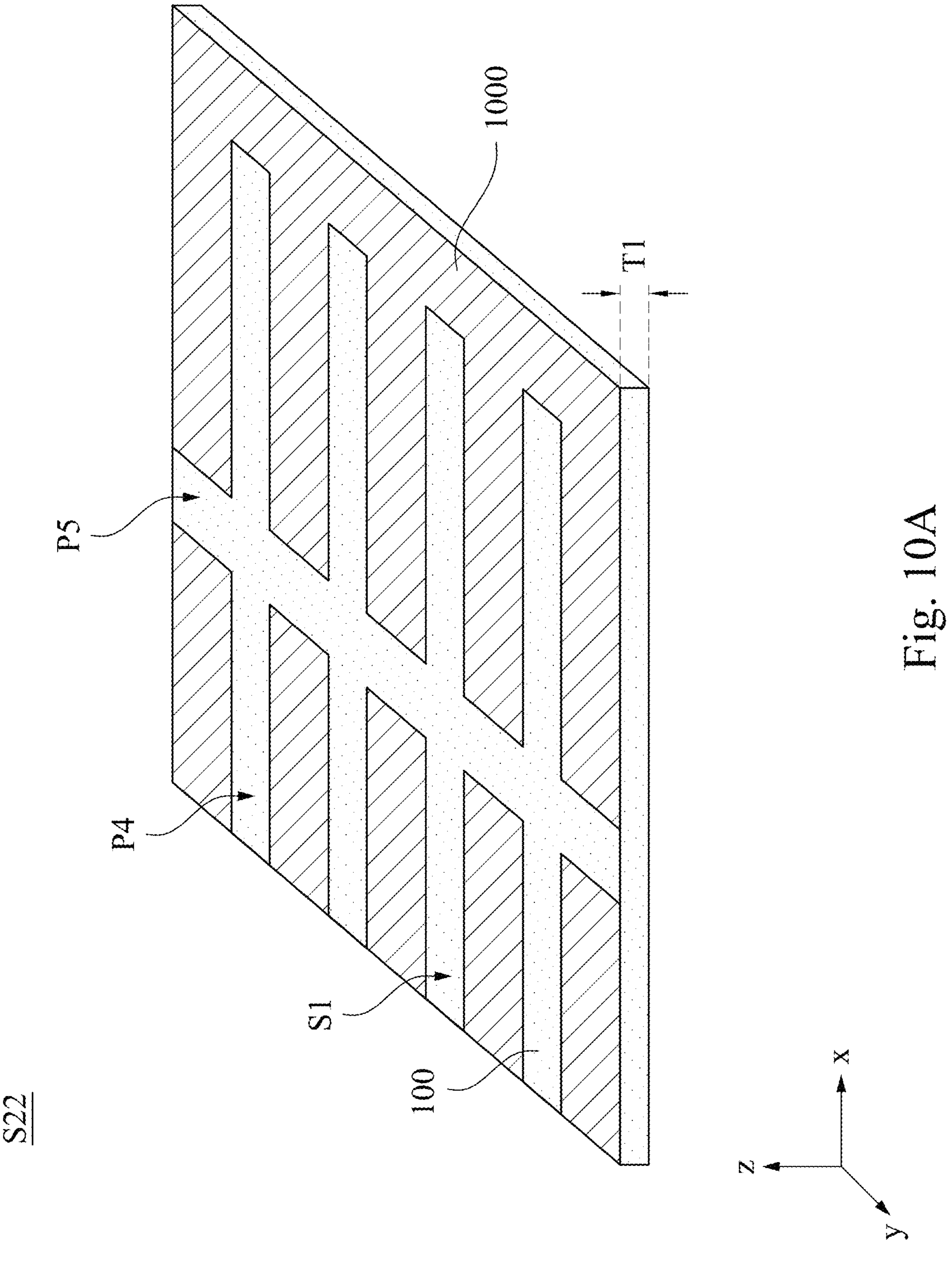
FIG. 10A is a view of an intermediate stage of fabricating a metal mask according to some other embodiments of the present disclosure.
Figure 10B:
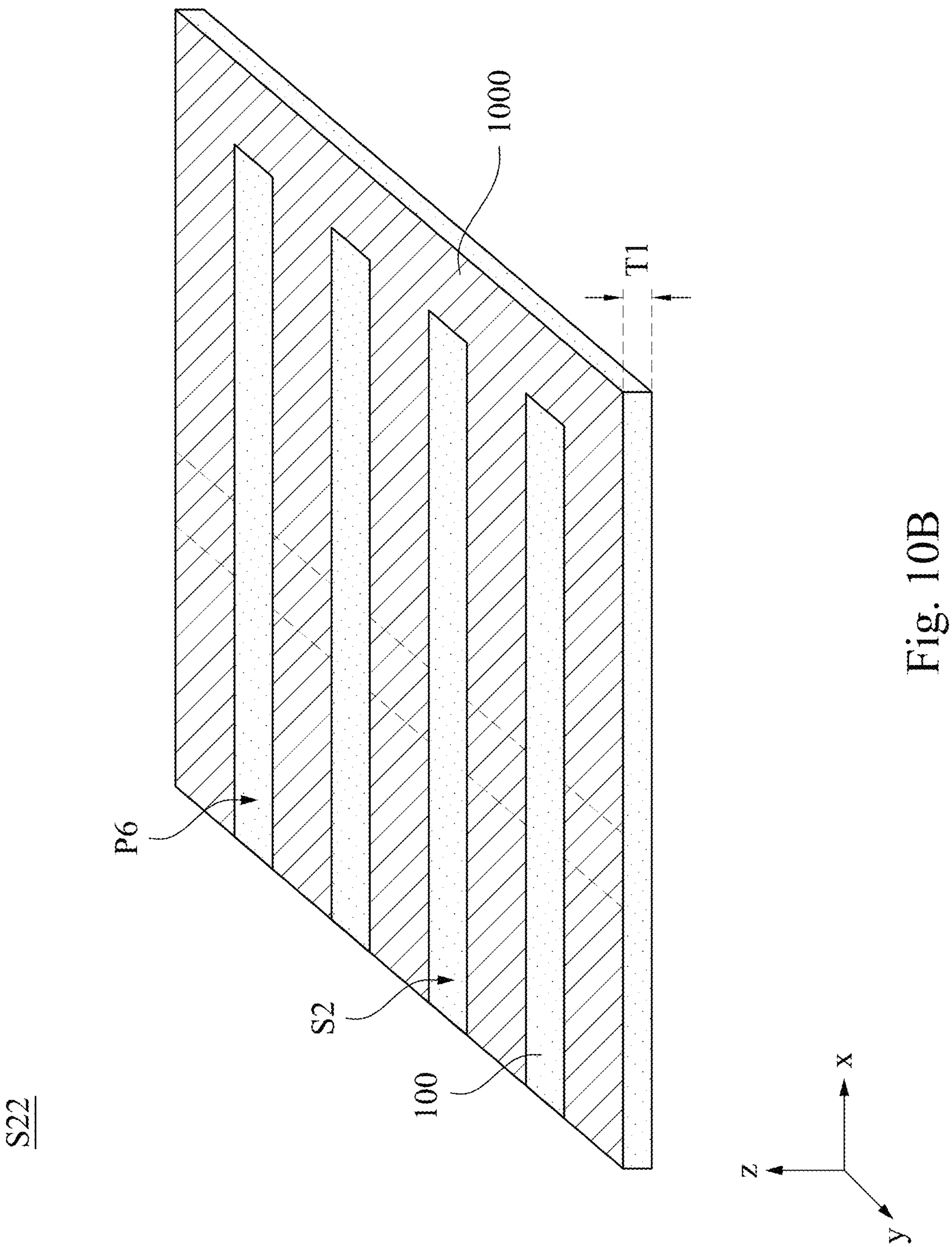
FIG. 10B is a view of FIG. 10A from another observation angle.

FIG. 10A and FIG. 10B illustrate step S22 of performing a lithography process to form a fourth pattern P4 on the first surface S1, a fifth pattern P5 on the first surface S1 and a sixth pattern P6 on the second surface S2. In detail, a photoresist 1000 is firstly formed on the first surface S1 and the second surface S2 of the metal planar substrate 100. Methods for forming the photoresist 1000, the fourth pattern P4, the fifth pattern P5 and the sixth pattern P6 can be similar to previous discussion in FIG. 2A and FIG. 2B, and therefore no further description is elaborated here. As shown in FIG. 10A and FIG. 10B, a portion of the metal planar substrate 100 can be exposed in the fourth pattern P4, the fifth pattern P5 and the sixth pattern P6.

The fourth pattern P4 and the fifth pattern P5 are on the first surface S1, and the sixth pattern P6 is on the second surface S2. The fourth pattern P4 may be similar to the first pattern P1 illustrated in FIG. 2A. Thus, the fourth pattern P4 can be elongated and extend in the first direction (e.g., extend along the x axis) until an edge of the metal planar substrate 100. The fifth pattern P5 may be similar to the second pattern P2 illustrated in FIG. 2A. Thus, the fifth pattern P5 can be elongated and extend in the second direction which may be perpendicular to the first direction (e.g., extend along the y axis). The sixth pattern P6 may be similar to the third pattern P3 illustrated in FIG. 2B. The sixth pattern P6 can be designed to correspond to the fourth pattern P4. For example, an arrangement of the sixth pattern P6 can be substantially the same as an arrangement of the fourth pattern P4. In other words, a projection of the fourth pattern P4 on the second surface S2 can overlap the sixth pattern P6 on the second surface S2. Thus, the sixth pattern P6 can also be elongated and extend in the first direction (e.g., extend along the x axis) until the edge of the metal planar substrate 100. The dashed lines illustrated in FIG. 10B indicate a projection of the fifth pattern P5 on the second surface S2. It is noted that the fifth pattern P5 may include less elongated openings than the second pattern P2 illustrated in 2A.

Figure 11A:
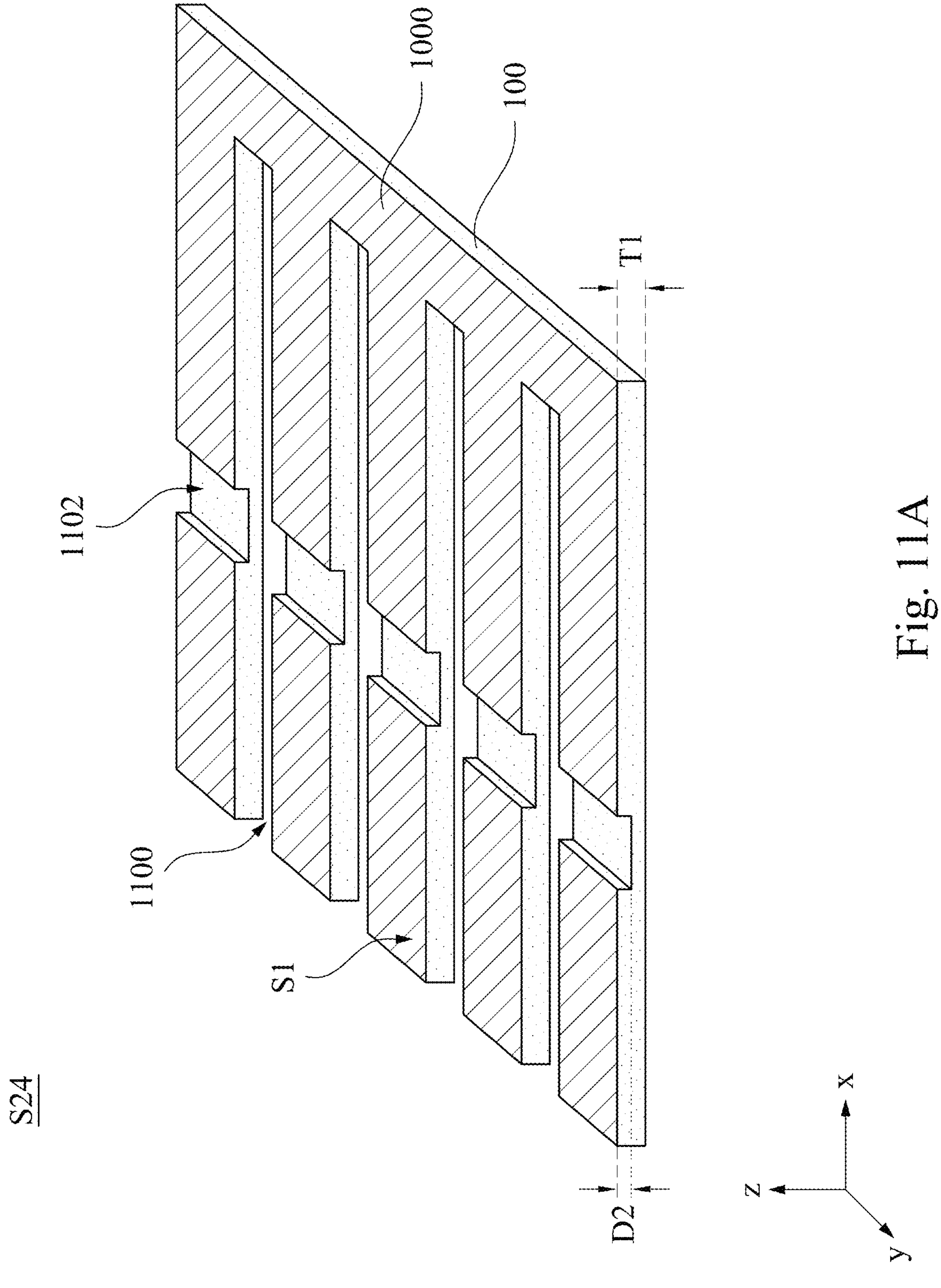
FIG. 11A is a view of an intermediate stage of fabricating a metal mask according to some other embodiments of the present disclosure.
Figure 11B:
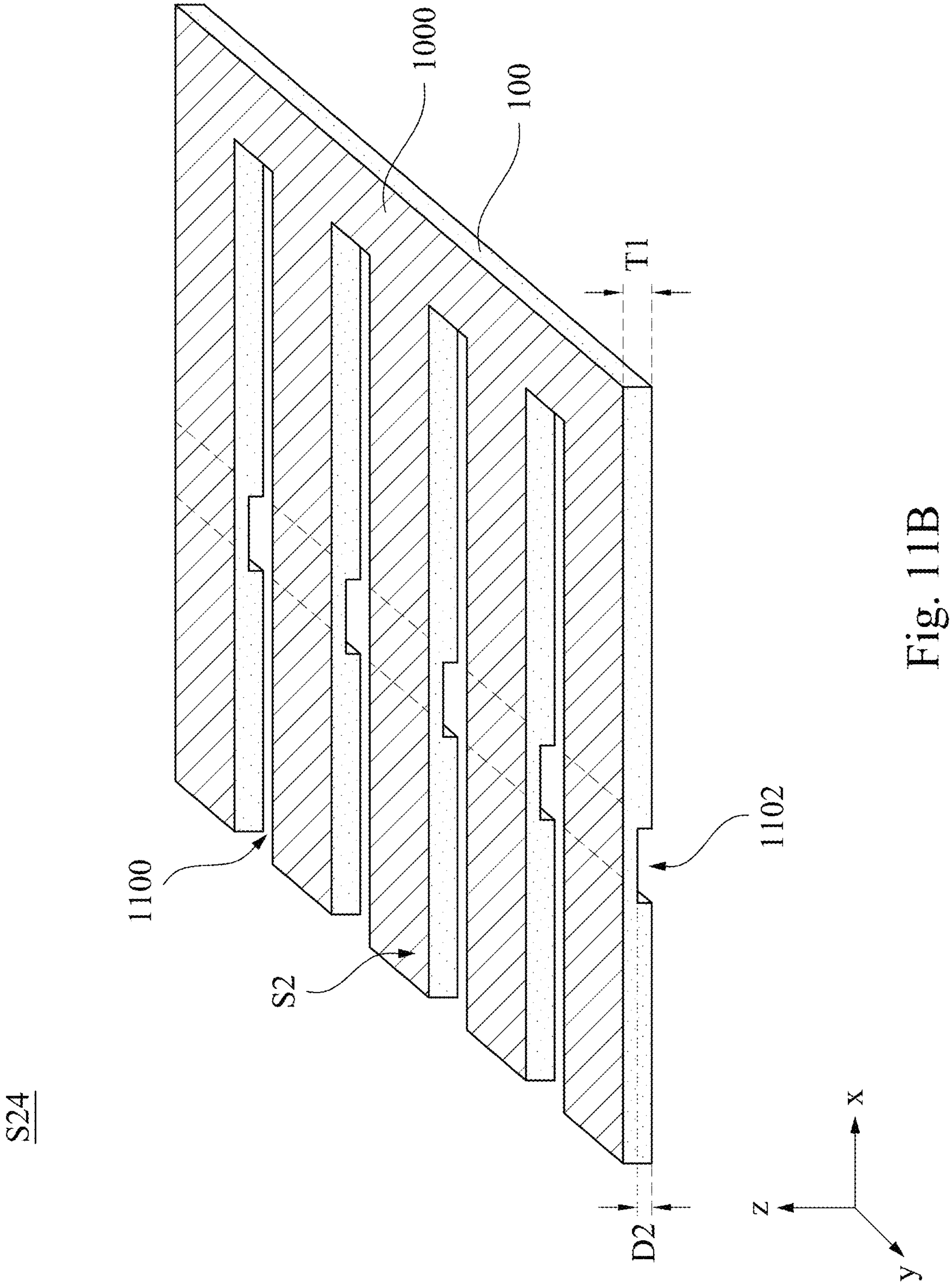
FIG. 11B is a view of FIG. 11A from another observation angle.

FIG. 11A and FIG. 11B illustrate step S24 of performing an etching process to remove the portion of the metal planar substrate exposed in the fourth pattern P4, the fifth pattern P5 and the sixth pattern P6. Multiple through holes 1100 may be formed by etching the metal planar substrate 100 through the fourth pattern P4 and the sixth pattern P6. A blind hole 1102 may be formed in the metal planar substrate 100 by etching the metal planar substrate 100 through the fifth pattern P5.

As discussed in step S14, during the etching process, etchants can concurrently etch the metal planar substrate 100 from the first surface S1 through the fourth pattern P4 and from the second surface S2 through the sixth pattern P6, thereby forming the through holes 1100 extending to the first surface S1 and the second surface S2. The etchants can etch the metal planar substrate 100 from the first surface S1 through the fifth pattern P5 to recess the first surface S1 of the metal planar substrate 100, thereby forming the blind hole 1102 in the first surface S1.

In a further description, during the etching process to remove the portion of the metal planar substrate 100, the thickness T1 of the metal planar substrate 100 may be reduced by at least about 25%. For example, about 25% of thickness T1, about 50% of thickness T1, or other suitable amount of thickness T1 may be removed off. In some embodiments, a removal amount for forming the blind hole 1102 can be about 25% of the thickness T1. In other words, a depth D2 of the blind hole 1102 may be about 25% of the thickness T1.

A pattern of the through holes 1100 can correspond to the fourth pattern P4 and the sixth pattern P6. Therefore, the through holes 1100 can be elongated and extend in the first direction (e.g., extend along the x axis) until the edge of the metal planar substrate 100. A pattern of the blind hole 1102 can correspond to the fifth pattern P5. Therefore, the blind hole 1102 can be elongated and extend in the second direction which is substantially perpendicular to the first direction (e.g., extend along the y axis). In some embodiments, a width of the blind hole 1102 (e.g., a dimension along the x axis) may be less than an individual width of the through holes 1100 (e.g., a dimension along the y axis).

Figure 12A:
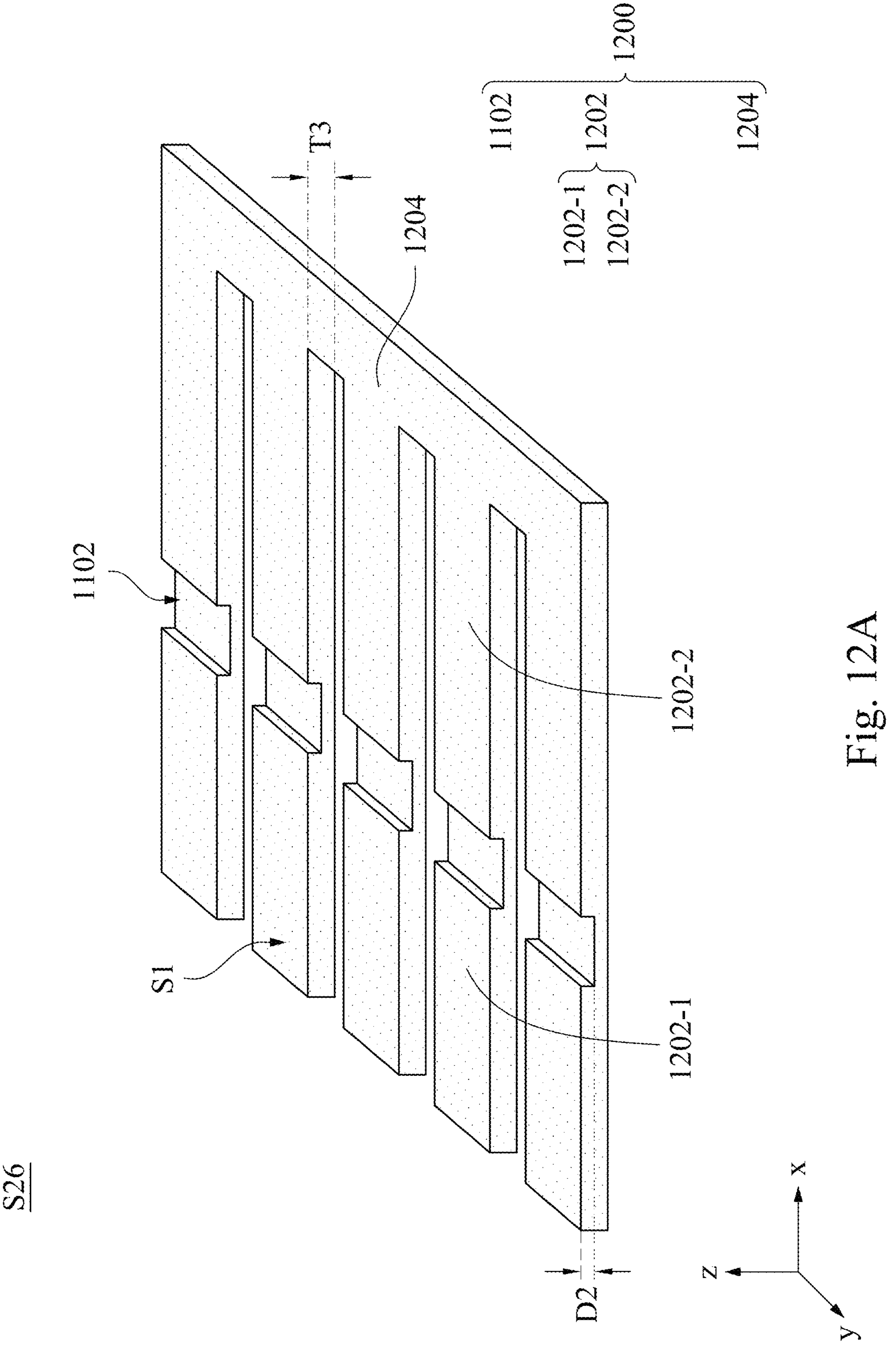
FIG. 12A is a view of an intermediate stage of fabricating a metal mask according to some other embodiments of the present disclosure.
Figure 12B:
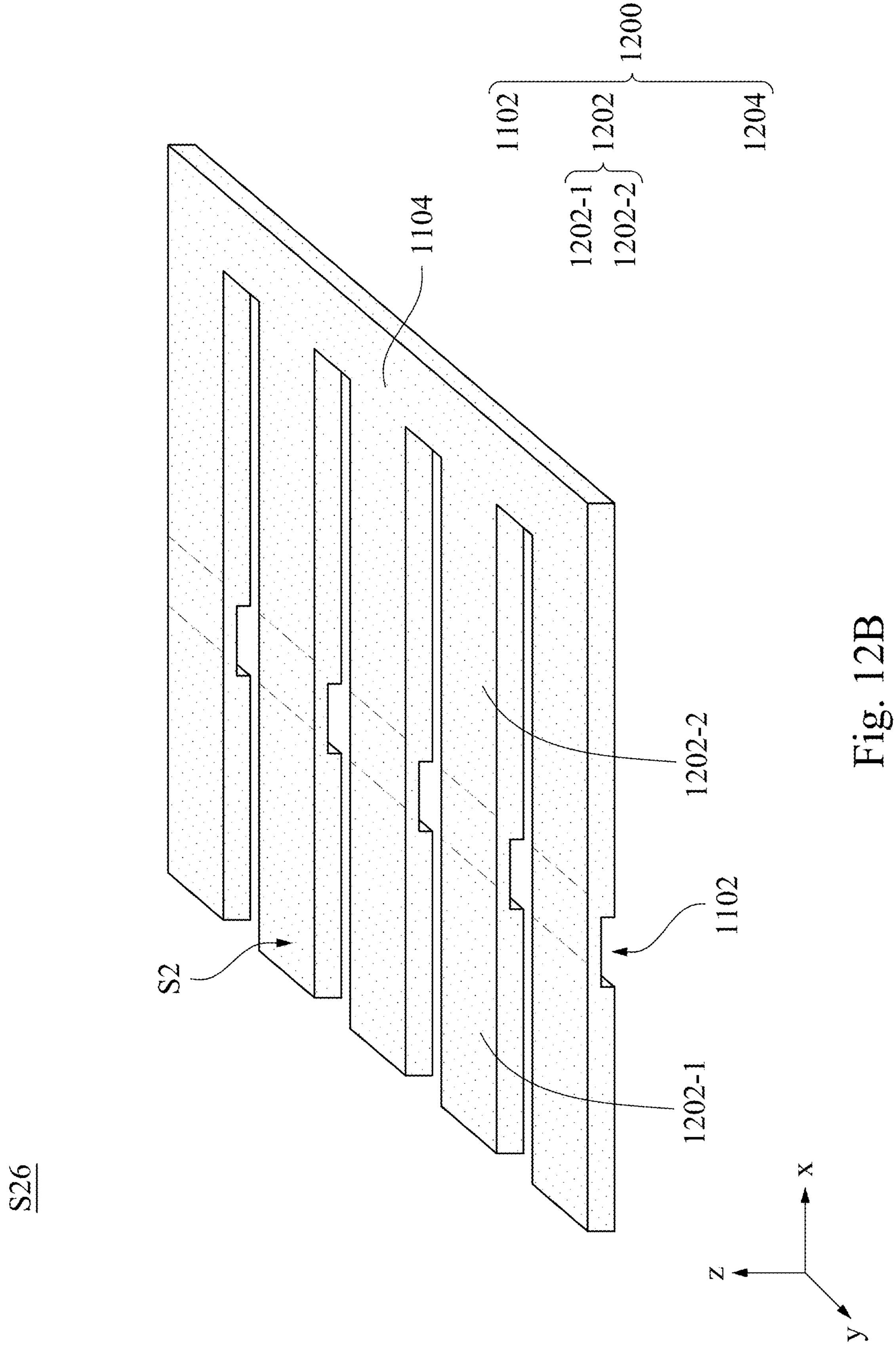
FIG. 12B is a view of FIG. 12A from another observation angle.

FIG. 12A and FIG. 12B illustrate step S26 of removing the photoresist 1000. After removing the photoresist 1000, the patterned metal planar substrate 100 can become a metal mask 1200. As shown in FIG. 12A and FIG. 12B, the metal mask 1200 can have multiple strip-shaped structures 1202, a board portion 1204, and the blind hole 1102. The strip-shaped structures 1202 can be connected to the board portion 1204 and extend in the first direction (e.g., extend along the x axis). One end of the strip-shaped structures 1202 may be at an edge of the metal mask 1200. The blind hole 1102 can be disposed in the first surface S1 and can be a recess in a direction from the first surface S1 to the second surface S2. In some embodiments, the blind hole 1102 can be elongated extending in the second direction which may be substantially perpendicular to the first direction (e.g., extend along the y axis) and across the strip-shaped structures 1202.

In previous step S24, the strip-shaped structures 1202 can be formed once the through holes 1100 (see FIG. 11A) are formed. The through holes 1100 and the strip-shaped structures 1202 can be alternately arranged. In other words, two adjacent strip-shaped structures 1202 can be spaced apart by the through holes 1100. As a result, the through holes 1100 defined by the fourth pattern P4 and the sixth pattern P6 can determine an arrangement of the strip-shaped structures 1202.

Specifically, the strip-shaped structures 1202 may include a first section 1202-1, a second section 1202-2 and a third section 1202-3. In some embodiments, the second section 1202-2 may connect the board portion 1204 and the first section 1202-1. In some embodiments, the blind hole 1402 may be between the first section 1202-1 and the second section 1202-2. In some embodiments where the thickness T1 (see FIG. 1) of the metal planar substrate 100 is uniform, a thickness T3 of the strip-shaped structures 1202 may be uniform. In some embodiments, the thickness T3 of the strip-shaped structures 1202 may substantially be the same as the thickness T1 (see FIG. 1) of the metal planar substrate 100. In some embodiments, the thickness T3 of the strip-shaped structures 1202 can be between about 20 μm and about 150 μm.

The blind hole 1102 may be positioned between the first section 1202-1 and the second section 1202-2. In some embodiments, the depth D2 from the first surface S1 to form the blind hole 1102 may be at least about 25% of the thickness T3 of the strip-shaped structures 1202. That is, the thickness T3 of the strip-shaped structures 1202 can be about 1 time to about 4 times the depth D2 from the first surface S1 to form the blind hole 1102. For example, the depth D2 of the blind hole 1102 can be about 50% of the thickness T3 of the strip-shaped structures 1202, meaning the thickness T3 of the strip-shaped structures 1202 can be about twice the depth D2 of the blind hole 1102.

In some embodiments, the blind hole 1102 can be used as a bending axis 1102 to bend the metal mask 1200. A greater detail will be described later with reference of FIG. 13. In the embodiments where the blind hole 1102 can be used as the bending axis 1102, before the metal mask 1200 is bent, the board portion 1204 and the second section 1202-2 may be positioned next to a first side of the bending axis 1102, and the first section 1202-1 may be positioned next to a second side of the bending axis 1102, where the first side and the second side are opposite to each other.

Figure 13:
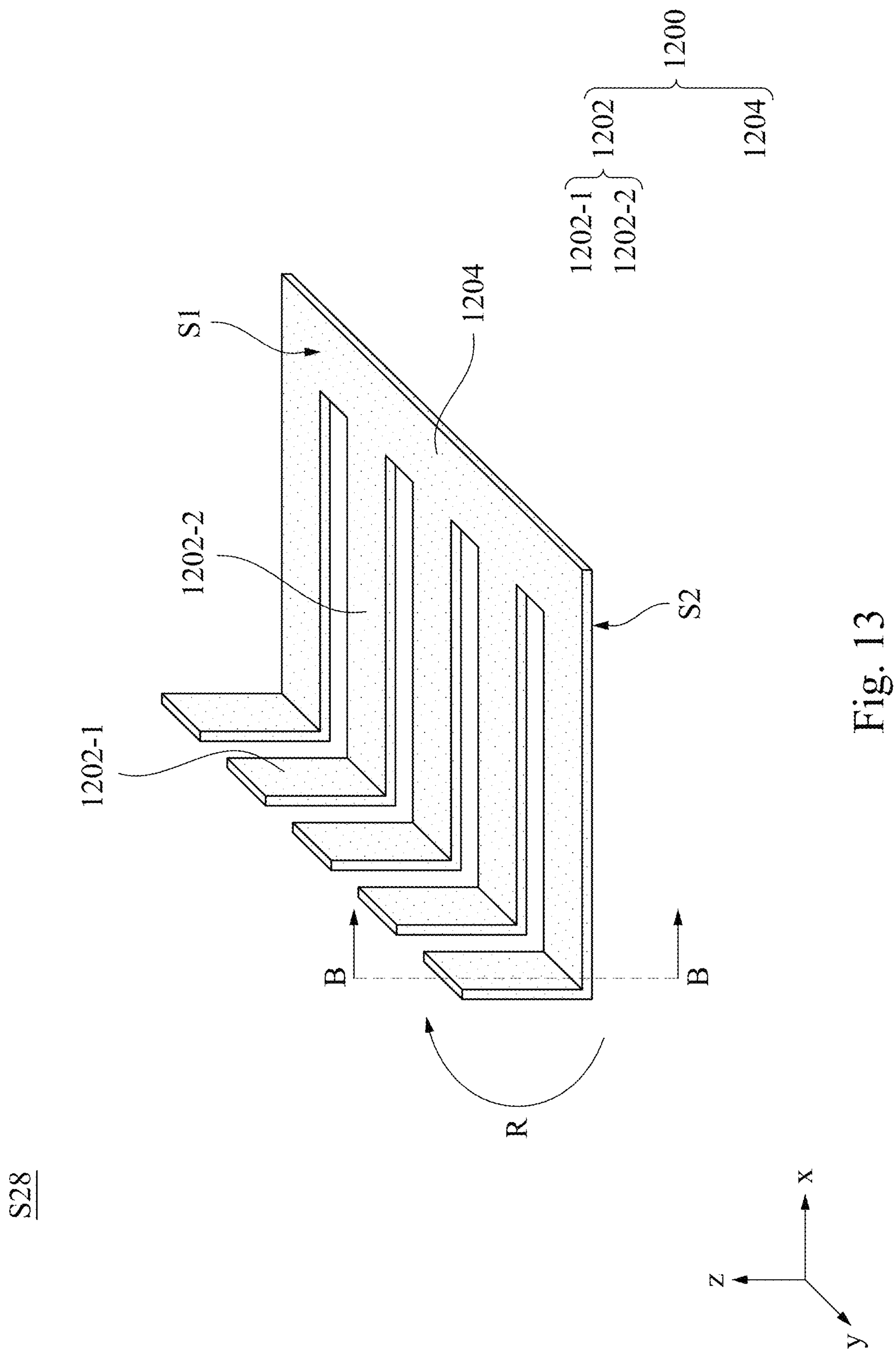
FIG. 13 is a view of an intermediate stage of fabricating a metal mask according to some other embodiments of the present disclosure.

FIG. 5 illustrates step 28 of using the blind hole 1102 as the bending axis 1102 to bend the metal mask 1200 such that the metal mask 1200 can become three-dimensional. In FIG. 13, the metal mask 1200 illustrated in FIG. 12A can be bent along a bending direction R to form the three-dimensional metal mask 1200.

Figure 14:
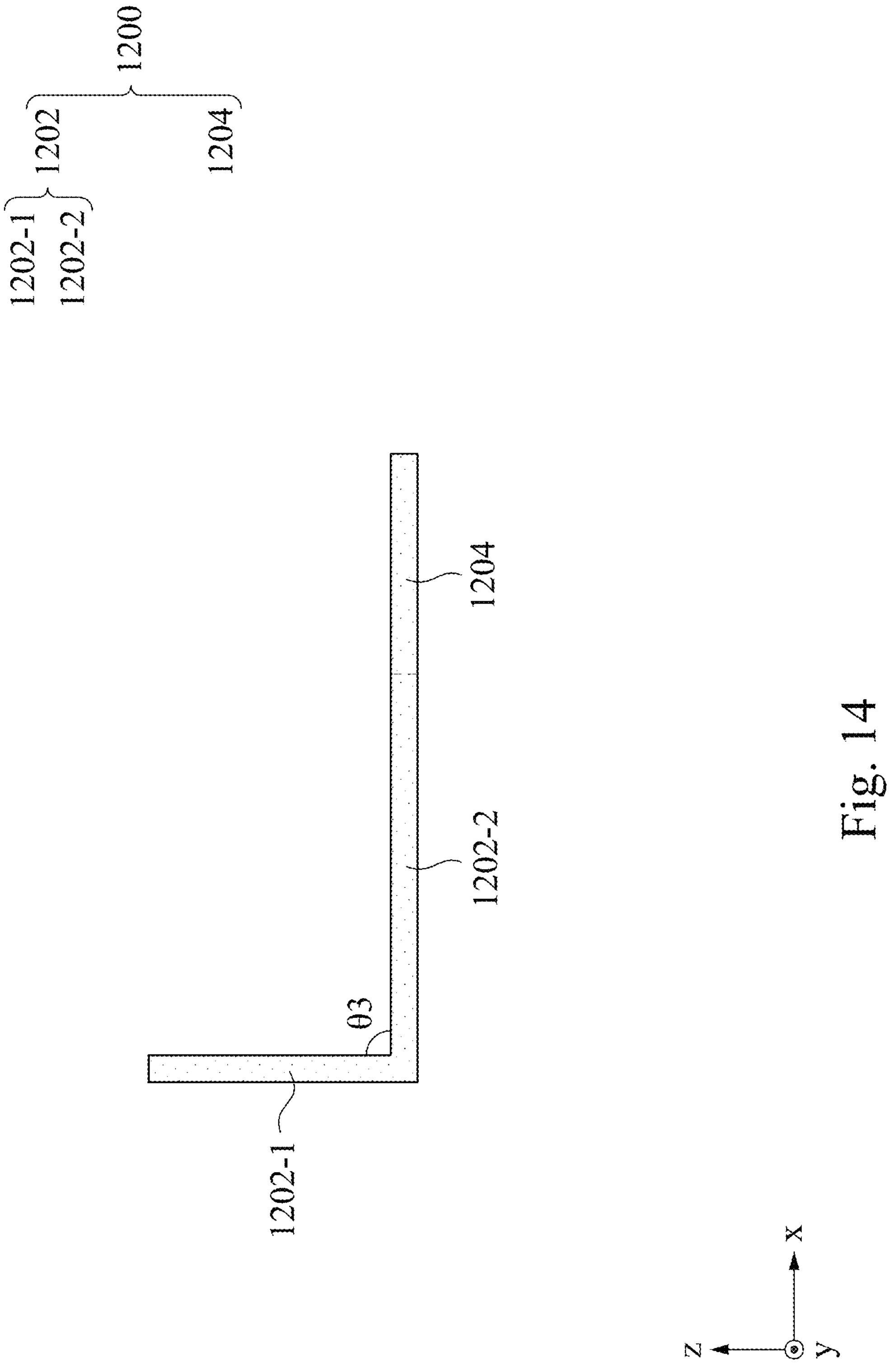
FIG. 14 is a cross-sectional of a metal mask taken along line B-B shown in FIG. 12 according to some other embodiments of the present disclosure.

Continuing in FIG. 13 and referring to FIG. 14 at the same time, FIG. 14 illustrates a cross-sectional view of the metal mask 1200 in a three-dimensional profile taken along line B-B shown in FIG. 13 according to some embodiments of the present disclosure. In some embodiments as illustrated in FIG. 14, after the metal mask 1200 is bent, a third angle θ3 is formed by the first section 1202-1 and the second section 1202-2. In some embodiments, the first section 1202-1 and the second section 1202-2 may collectively form an L-shaped structure in a cross-sectional view of the three-dimensional metal mask 1200.

Referring to FIG. 15 to FIG. 18, FIG. 15 to FIG. 18 are views of various intermediate stages of applying the metal mask 1200 in the three-dimensional profile illustrated in FIG. 13 according to some embodiments of the present disclosure. For example, the metal mask 1200 in the three-dimensional profile is used to form wires at the edge of a slab-shaped substrate. Various operations of embodiments are provided herein. The order in which some or all of the operations are described should not be construed to imply that these operations are necessarily order dependent. Alternative ordering will be appreciated having the benefit of this description. Additional operations can be provided before, during, and/or after these operations in FIG. 15 to FIG. 18, and may be briefly described herein. Further, it will be understood that not all operations are necessarily present in each embodiment provided herein. Also, it will be understood that not all operations are necessary in some embodiments.

Figure 15:
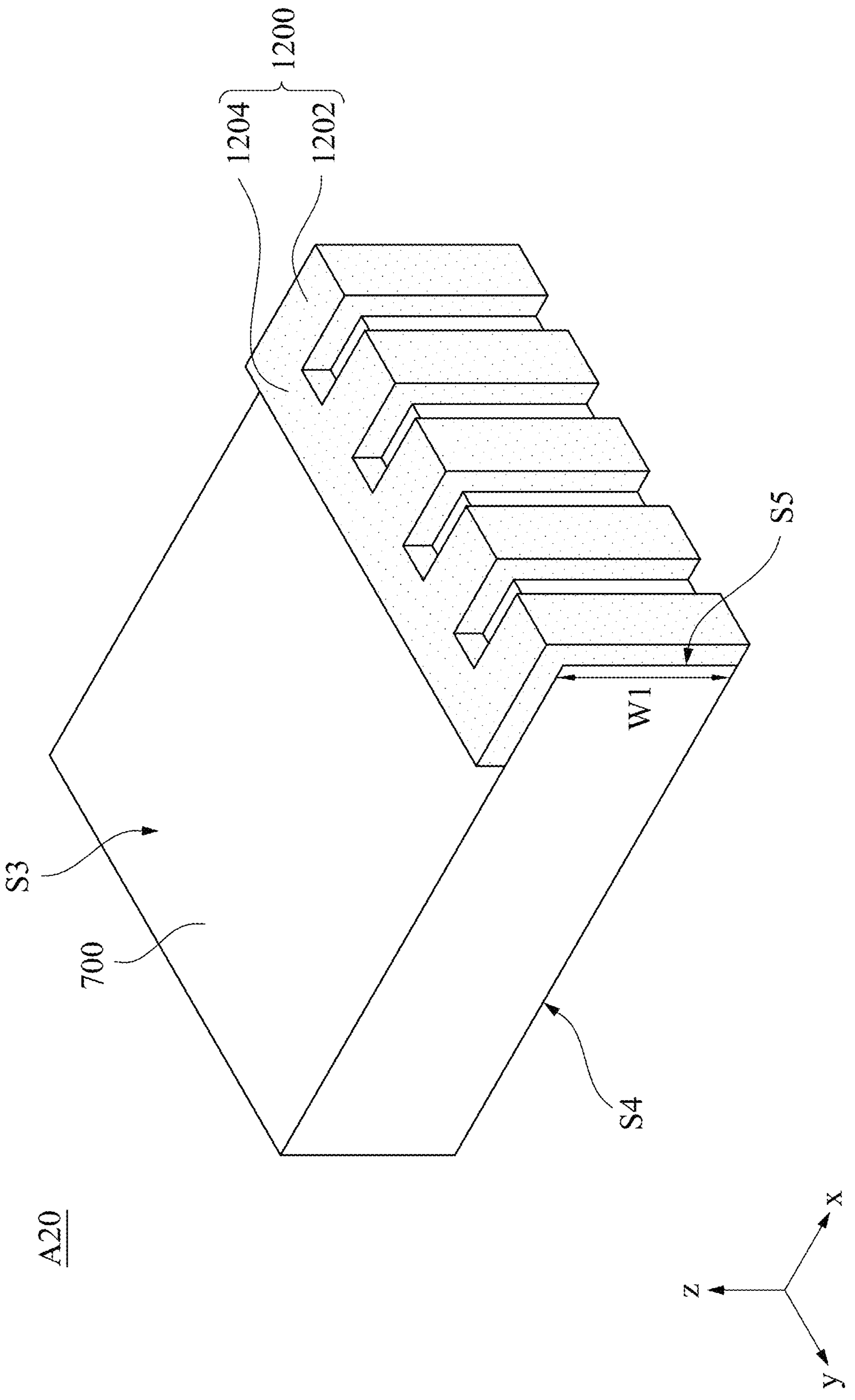
FIG. 15 to FIG. 18 are views of various intermediate stages of applying a metal mask shown in FIG. 13 according to some other embodiments of the present disclosure.

FIG. 15 illustrates step A20 of receiving the slab-shaped substrate 700 and disposing the metal mask 1200 in the three-dimensional profile at the edge of the slab-shaped substrate 700. In detail, the board portion 1204 of the metal mask 1200 can directly contact the third surface S3 of the slab-shaped substrate 700. The third surface S3 may be parallel to the xy plane. The strip-shaped structures 1202 of the metal mask 1200 can directly contact the third surface S3 and the fifth surface S5. The fifth surface S5 may be parallel to the yz plane.

The three-dimensional profile of the metal mask 1200 is designed to be consistent with a profile of the slab-shaped substrate 700, thereby allowing the three-dimensional metal mask 1200 to fit the edge area of the slab-shaped substrate 700. In some embodiments, the width W1 of the slab-shaped substrate 700 can substantially be the same as a length of the first section 1202-1 of the strip-shaped structures 1202.

Figure 16:
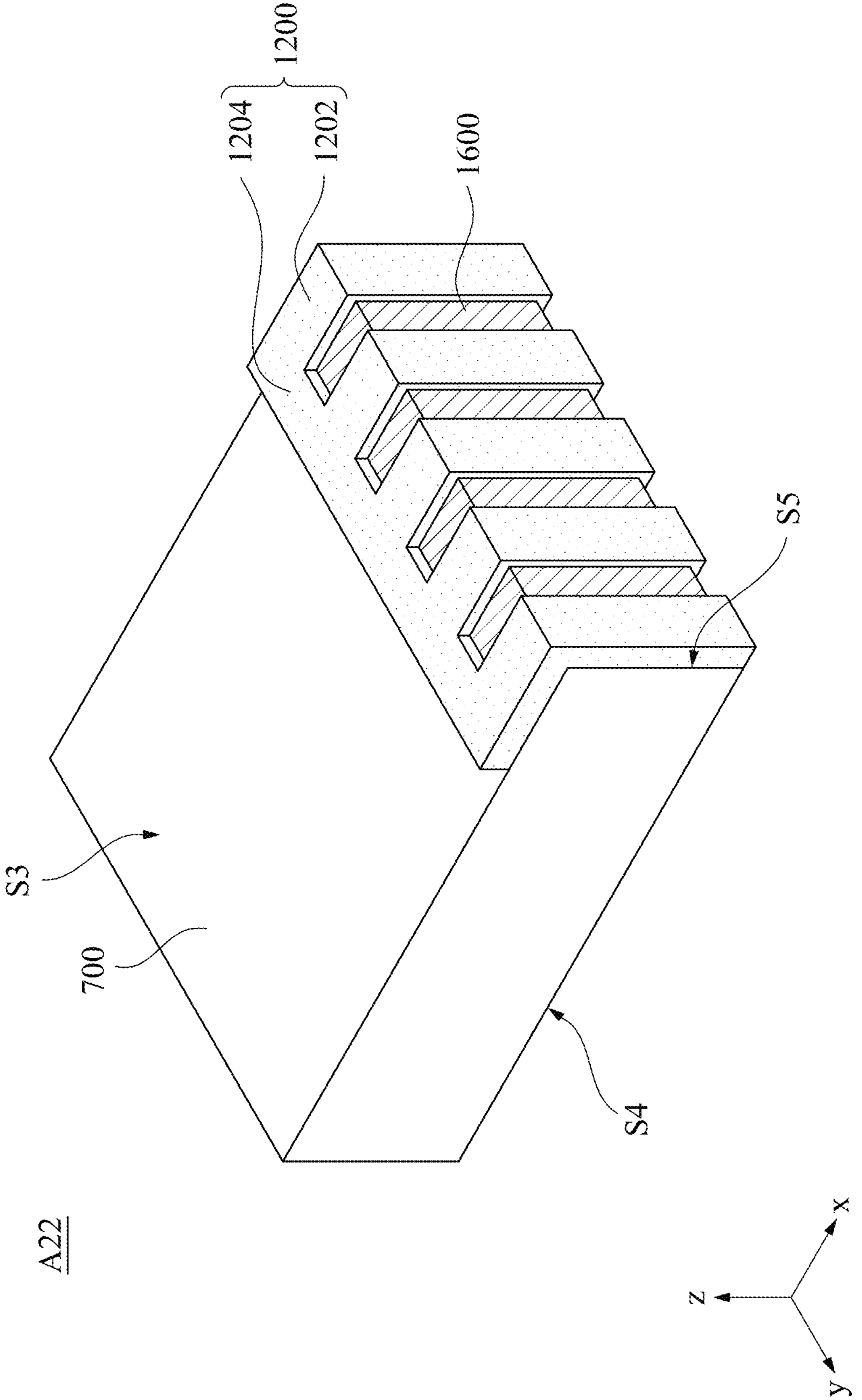

FIG. 16 illustrates step A22 of forming a first metal material 1600 on an exposed portion of the slab-shaped substrate 700 without the metal mask 1200 covered. The first metal material 1600 may be formed on the third surface S3 and the fifth surface S5 of the slab-shaped substrate 700. Specifically, the first metal material 1600 can be formed between each of the strip-shaped structures 1202. A thickness of the first metal material 1600 may be less than a thickness of the metal mask 1200 (e.g. the thickness T3 shown in FIG. 12A). In some embodiments, a mask (not illustrated here) may be used to cover some other portions of the slab-shaped substrate 700 to avoid the first metal material 1600 from appearing thereon. In some embodiments, the first metal material 1600 can be formed by a sputtering process, an evaporation process, or any suitable process. It is noted that, in an actual operation, the first metal material 1600 may be formed not only on the exposed portion of the slab-shaped substrate 700 but also on the metal mask 1200. For clarity, FIG. 16 is simplified by omitting to illustrate a portion of the first metal material 1600 on the metal mask 1200.

Figure 17:
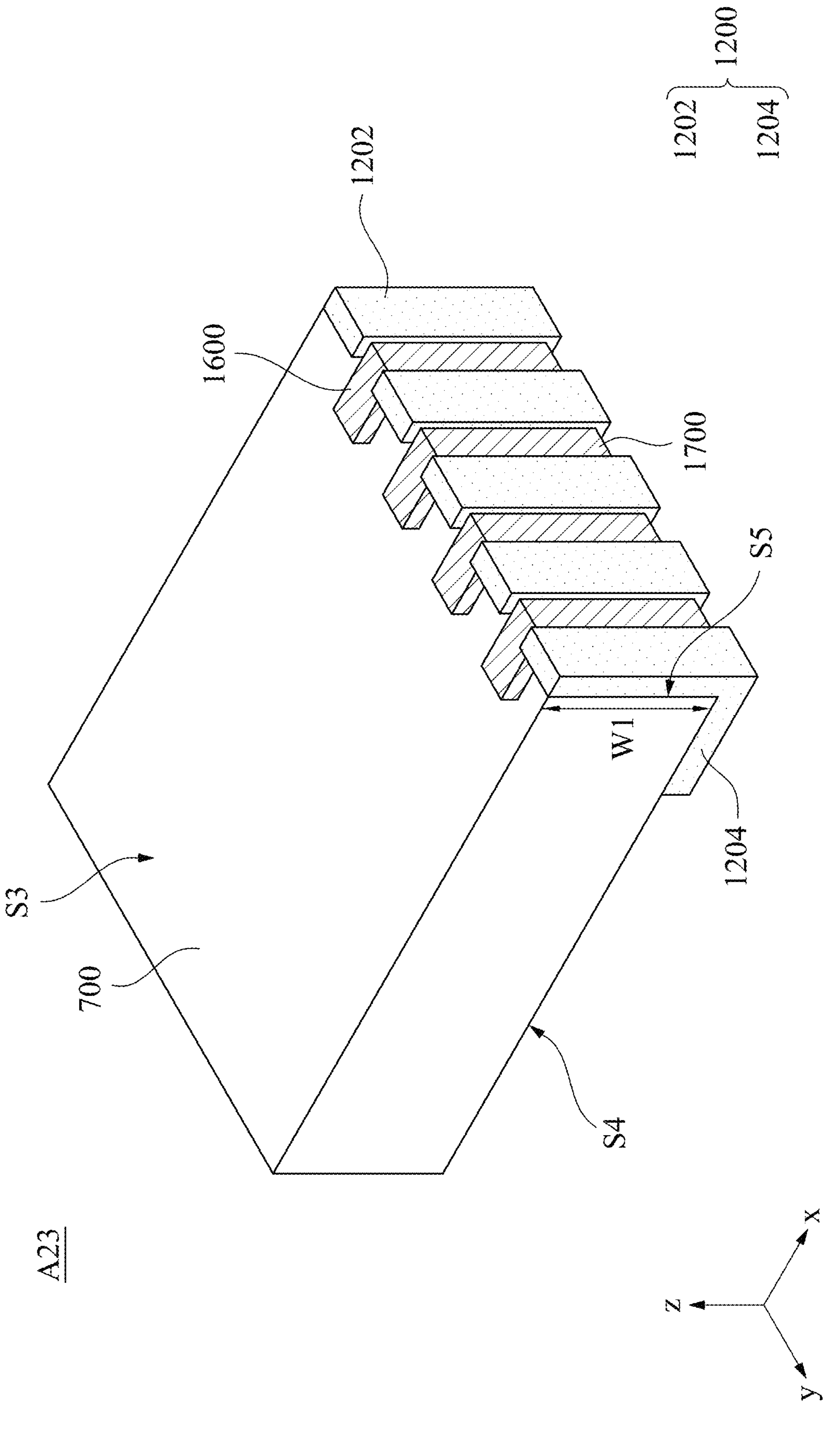

FIG. 17 illustrates step A23 of inverting the metal mask 1200 in FIG. 16 and then disposing the metal mask 1200 at the same edge of the slab-shaped substrate 700. In an embodiment as illustrated in FIG. 17, the board portion 1204 of the metal mask 1200 can directly contact the fourth surface S4 of the slab-shaped substrate 700. The strip-shaped structures 1202 of the metal mask 1200 can directly contact the fourth surface S4 as well as the fifth surface S5.

It is noted that, in step A23, a location on the fifth surface S5 where the metal mask 1200 is disposed can be corresponding aligned with a location on the fifth surface S5 where the first metal material 1600 is formed. In other words, that the first metal material 1600 and the strip-shaped structures 1202 are alternately disposed on the fifth surface S5 can be observed after the metal mask 1200 is disposed at the same edge of the slab-shaped substrate 700.

Subsequently, a second metal material 1700 can be formed on an exposed portion of the slab-shaped substrate 700 without the metal mask 1200 covered. In an embodiment as illustrated in FIG. 17, the second metal material 1700 can be formed on the fourth surface S4 and the fifth surface S5. Specifically, the second metal material 1700 can be formed between each of the strip-shaped structures 1202. A thickness of the second metal material 1700 may be less than a thickness of the metal mask 1200 (e.g. the thickness T3 shown in FIG. 12A). In some embodiments, a mask (not illustrated here) may be used to cover some other portions of the slab-shaped substrate 700 to avoid the second metal material 1700 from appearing thereon.

In some embodiments, the second metal material 1700 can be formed by a sputtering process, an evaporation process, or any suitable process. It is noted that, in an actual operation, the second metal material 1700 may be formed not only on the exposed portion of the slab-shaped substrate 700 but also on the metal mask 1200. For clarity, FIG. 17 is simplified by omitting to illustrate a portion of the second metal material 1700 on the metal mask 1200.

Further, since a metal material (e.g., the first metal material 1600 and the second metal material 1700) is repeatedly formed on the fifth surface S5 in step A22 and A23, the above-mentioned metal material can be a double-layer stack including the first metal material 1600 and the second metal material 1700. In some embodiments, a thickness of the above-mentioned double-layer stack may be less than a thickness of the metal mask 1200 (e.g. the thickness T3 shown in FIG. 12A).

Figure 18:
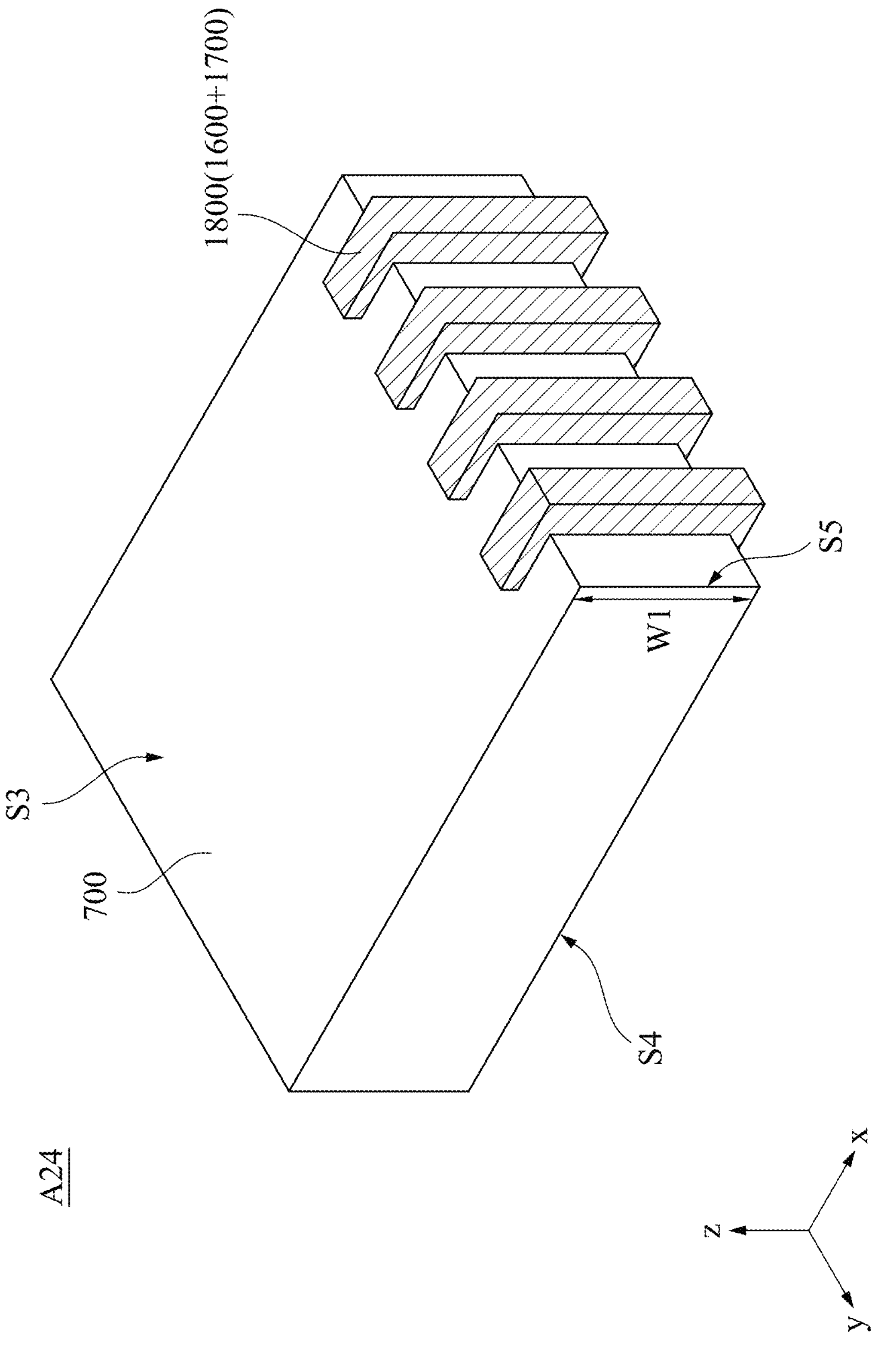

FIG. 18 illustrates step A24 of removing the metal mask 1200 such that the first metal material 1600 and the second metal material 1700 are remained and can collectively become metal wires 1800 at the edge of the slab-shaped substrate 700. The metal wires 1800 can extend on the third surface S3, the fourth surface S4 and the fifth surface S5 continuously. The metal wires 1800 can electrically connect various electrical components (not illustrated here) separately disposed on the third surface S3 and fourth surface S4. A thickness of the metal wires 1800 on the fifth surface S5 may be greater than a thickness of the metal wires 1800 either on the third surface S3 or the fourth surface S4. In some embodiments, the thickness of the metal wires 1800 on the fifth surface S5 may be about twice the thickness of the metal wires 1800 on the third surface S3 or the fourth surface S4.

The present disclosure discloses various embodiments to provide a metal mask and a method of fabricating thereof. Thus, a metal mask can be formed through a more convenient process.

A bending axis formed in the metal mask can facilitate an operation of bending the metal mask to turn the metal mask into a three-dimensional metal mask. Thus, the resulted three-dimensional metal mask can fit an edge area of a slab-shape substrate. Then, by a sputter process or an evaporation process through the metal mask, metal wires can be formed on three surfaces near the edge area of the slab-shape substrate to electrically connect various electrical components separately disposed on two opposite sides of the slab-shaped substrate. Therefore, using the metal mask during forming the metal wires near the edge area of the slab-shaped substrate can simplify fabrication process and reduce process cost. In addition, the metal mask disclosed in the present disclosure can be made of metal. Due to a lower coefficient of heat expansion of the metal than other materials (e.g., polymer), the metal mask may be capable of a wide range of operation temperature and better process reliability when the metal mask is used in a process related to heating or change of temperature.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of fabricating a metal mask, comprising:
- receiving a metal planar substrate, wherein the metal planar substrate comprises:
  - a first surface; and
  - a second surface, opposite to the first surface; and
- patterning the metal planar substrate, comprising:
  - forming a plurality of strip-shaped structures;
  - forming a plurality of through holes, wherein the plurality of through holes extends to the first surface and the second surface, and the plurality of through holes and the plurality of strip-shaped structures are alternately arranged; and
  - forming a blind hole in a direction from the first surface to the second surface, wherein the blind hole extends across the plurality of through holes.

2. The method of fabricating the metal mask of claim 1, wherein the plurality of through holes is elongated and extends in a first direction.

3. The method of fabricating the metal mask of claim 2, wherein the blind hole is elongated and extends in a second direction substantially perpendicular to the first direction.

4. The method of fabricating the metal mask of claim 1, wherein the metal planar substrate includes a thickness between 20 μm and 150 μm.

5. The method of fabricating the metal mask of claim 1, wherein a thickness of the metal planar substrate is same as a thickness of the plurality of strip-shaped structures.

6. The method of fabricating the metal mask of claim 1, wherein the patterning the metal planar substrate comprises performing a lithography process to form a first pattern on the first surface extending in a first direction, a second pattern on the first surface extending in a second direction and a third pattern corresponding to the first pattern on the second surface, wherein the first direction and the second direction are perpendicular to each other.

7. The method of fabricating the metal mask of claim 6, wherein the patterning the metal planar substrate comprises performing an etching process to remove a portion of the metal planar substrate such that the plurality of through holes is formed through the first pattern and the third pattern, and the blind hole is formed through the second pattern.

8. The method of fabricating the metal mask of claim 7, wherein the performing the etching process to remove the portion of the metal planar substrate comprises reducing a thickness of the metal planar substrate by at least 25%.

9. The method of fabricating the metal mask of claim 7, wherein subsequent to performing the etching process to remove the portion of the metal planar substrate, a thickness of the plurality of strip-shaped structures is 1 time to about 4 times of a depth of the blind hole.

10. The method of fabricating the metal mask of claim 1, further comprising, after the patterning the metal planar substrate, using the blind hole as a bending axis to bend the metal planar substrate such that the metal mask becomes three-dimensional.

11. The method of fabricating the metal mask of claim 10, wherein after using the blind hole as a bending axis to bend the metal planar substrate, the metal mask has a L-shaped profile in a cross-sectional view.

12. A method of fabricating a metal mask, comprising:
- receiving a metal planar substrate, wherein the metal planar substrate comprises:

a first surface; and
a second surface, opposite to the first surface;

performing a lithography process to form a first pattern on the first surface extending in a first direction, a second pattern on the first surface extending in a second direction and a third pattern corresponding to the first pattern on the second surface, wherein the first direction and the second direction are perpendicular to each other;

performing an etching process to remove a portion of the metal planar substrate such that a plurality of through holes is formed through the first pattern and the third pattern, and a plurality of blind holes is formed through the second pattern; and using the plurality of blind holes as bending axis respectively to bend the metal planar substrate such that the metal mask becomes three-dimensional.

13. The method of fabricating the metal mask of claim 12, wherein subsequent to using the plurality of blind holes as bending axis to bend the metal planar substrate, the metal mask has a C-shaped profile in a cross-sectional view.

14. The method of fabricating the metal mask of claim 12, wherein subsequent to forming the plurality of through holes, a plurality of strip-shaped structures is formed, and the plurality of through holes and the plurality of strip-shaped structures are alternately arranged.

15. The method of fabricating the metal mask of claim 12, wherein subsequent to performing the etching process to remove the portion of the metal planar substrate, a thickness of the metal planar substrate is 1 time to about 4 times of a depth of the plurality of blind holes.

* * * * *